(12) United States Patent
White

(10) Patent No.: US 9,012,811 B2
(45) Date of Patent: Apr. 21, 2015

(54) PRINTED CIRCUIT BOARD WITH EMBEDDED HEATER

(75) Inventor: Gil White, Aliso Viejo, CA (US)

(73) Assignee: Viasystems Technologies Corp. L.L.C., St. Louis, MO (US)

( * ) Notice: Subject to any disclaimer, the term of this patent is extended or adjusted under 35 U.S.C. 154(b) by 284 days.

(21) Appl. No.: 13/482,702

(22) Filed: May 29, 2012

(65) Prior Publication Data

US 2013/0180973 A1 Jul. 18, 2013

Related U.S. Application Data

(60) Provisional application No. 61/586,691, filed on Jan. 13, 2012.

(51) Int. Cl.
 H05B 3/28 (2006.01)
 H05B 3/30 (2006.01)
 H05K 7/20 (2006.01)
 H05K 1/02 (2006.01)
 H05K 1/16 (2006.01)

(52) U.S. Cl.
 CPC .............. *H05K 1/0212* (2013.01); *H05B 3/28* (2013.01); *H05B 2203/004* (2013.01); *H05K 1/167* (2013.01); *H05K 7/20* (2013.01); *H05K 2203/1115* (2013.01); *H05K 2203/06* (2013.01)

(58) Field of Classification Search
 None
 See application file for complete search history.

(56) References Cited

U.S. PATENT DOCUMENTS

| | | | | |
|---|---|---|---|---|
| 3,440,407 A * | 4/1969 | Amato et al. | | 219/494 |
| 4,374,316 A * | 2/1983 | Inamori et al. | | 219/209 |
| 5,010,233 A * | 4/1991 | Henschen et al. | | 219/209 |
| 5,268,558 A * | 12/1993 | Youssef et al. | | 219/209 |
| 5,539,186 A * | 7/1996 | Abrami et al. | | 219/548 |
| 5,896,259 A * | 4/1999 | Farwell et al. | | 361/78 |
| 6,031,729 A * | 2/2000 | Berkely et al. | | 361/771 |
| 6,114,674 A * | 9/2000 | Baugh et al. | | 219/543 |
| 6,184,494 B1 * | 2/2001 | Isokoski et al. | | 219/209 |
| 6,396,706 B1 | 5/2002 | Wohlfarth | | |
| 6,541,736 B1 * | 4/2003 | Huang et al. | | 219/209 |
| 6,621,055 B2 * | 9/2003 | Weber et al. | | 219/494 |
| 8,059,424 B2 * | 11/2011 | Glever et al. | | 361/767 |
| 8,481,897 B2 * | 7/2013 | Woelfel | | 219/543 |
| 2002/0162829 A1* | 11/2002 | Weber et al. | | 219/209 |
| 2003/0139142 A1* | 7/2003 | Wang | | 455/67.1 |
| 2004/0020687 A1* | 2/2004 | Moore | | 174/254 |
| 2004/0035840 A1* | 2/2004 | Koopmans | | 219/209 |
| 2006/0065431 A1 | 3/2006 | Trucco | | |
| 2010/0282730 A1* | 11/2010 | Marcus et al. | | 219/209 |
| 2012/0268674 A1* | 10/2012 | Dunn | | 349/21 |

OTHER PUBLICATIONS

International Search Report regarding PCT/US2013/021193, issued Jan. 11, 2013, 7 pages.

* cited by examiner

*Primary Examiner* — Joseph M Pelham
(74) *Attorney, Agent, or Firm* — Polsinelli PC

(57) ABSTRACT

Aspects of the present invention are directed to providing a printed circuit board including a top conductive layer; a bottom conductive layer; a plurality of electronic components arranged on at least one of the top conductive layer or the bottom conductive layer; a heater layer interposed between the top conductive layer and the bottom conductive layer and configured to generate and transfer heat to at least one of the electronic components.

13 Claims, 15 Drawing Sheets

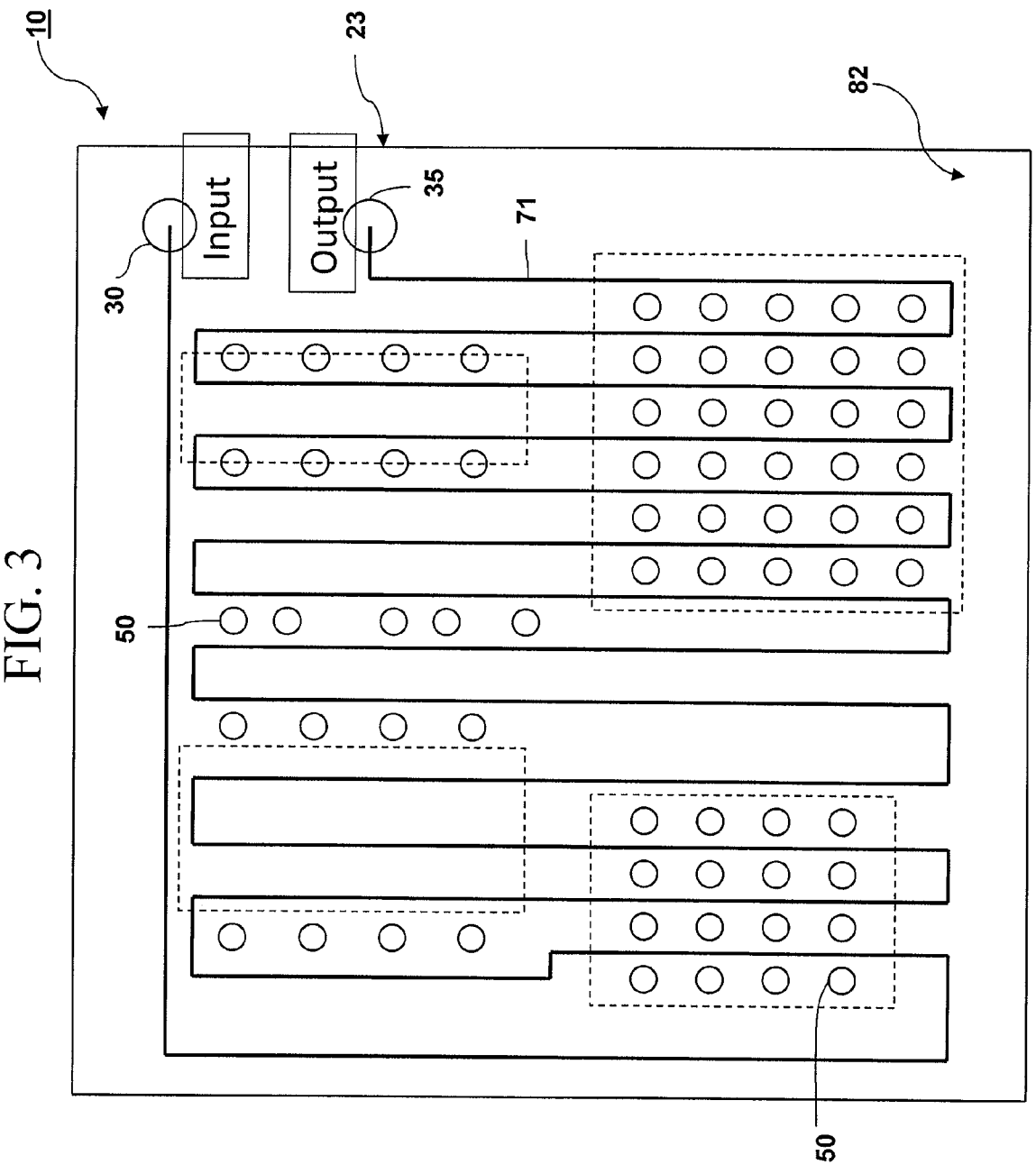

PRINTED CIRCUIT BOARD WITH EMBEDDED HEATER

CROSS-REFERENCE TO RELATED APPLICATION

This application claims the benefit of U.S. Provisional Patent Application Ser. No. 61/586,691, filed on Jan. 13, 2012, the contents of which are fully incorporated herein by reference.

FIELD

Aspects of the present invention relate generally to printed circuit (wiring) boards, and more particularly, to a printed circuit board with an embedded heater.

BACKGROUND

Printed circuit boards (PCBs), are used in many electronic systems or devices, for example, smart phones, networks, servers, routers, computers, automobiles, aviation, video games, TVs., etc. PCBs are used to mechanically support and couple electronic components. PCBs may couple the electronic components through conductive pathways (e.g., signal traces). These conductive pathways may be formed, for example, by etching a conductive material (e.g., copper foil) on a non-conductive substrate (e.g., a laminate material). PCBs may include one or more circuit cores, substrates, pads, or vias. Additionally, PCBs may be multilayered, for example, a PCB may have a top conductive layer, a bottom conductive layer, and one or more internal conductive layers.

Electronic components included on PCBs may have a temperature range in which they are designed to operate within. For example, a standard operating temperature of some electronic components is from about −40 to about 85 degrees Celsius (C). When electronic components are operated outside their designed operating temperature, they may not function properly. However, some applications require that electronic components operate in an environment below their designed operating temperature (e.g., at temperatures lower than −40 degrees C.). For example, an airplane sitting on a runway in Alaska with ambient temperatures of −60 degrees C. may have electronic components rated only to −40 degrees C. In such a scenario, it may be desirable to heat up the components to within their operating range (e.g., above −40 degrees C.). Further, it may be desirable to heat up the electronic components prior to applying system power.

Additionally, in other scenarios, it may be desirable to heat up the electronic components in a relatively short time period. For example, military jets may be required to scramble within a twenty minute period and may not tolerate a slow heat-up or heater failure.

SUMMARY

An aspect of embodiments of the present invention is directed toward providing an embedded heater of a printed circuit board, which can improve the operation of electronic components in low temperature environments.

Another aspect of embodiments of the present invention is directed toward providing an embedded heater of a printed circuit board, which can warm-up the electronic components in a relatively short period of time.

Aspects of embodiments of the present invention provide a printed circuit board including a top conductive layer; a bottom conductive layer; a plurality of electronic components arranged on at least one of the top conductive layer or the bottom conductive layer; a heater layer interposed between the top conductive layer and the bottom conductive layer and configured to generate and transfer heat to at least one of the electronic components.

At least one of the electronic components has an operating temperature range, and the heater layer is configured to generate heat to raise the temperature of the at least one electronic component from a first temperature below the operating temperature range to a second temperature within the operating temperature range. The operating temperature range may be from about −40 to about 85 degrees Celsius.

In an embodiment, the heater layer includes an input via; an output via; a substrate; and a conductive pattern located on the substrate and configured to generate heat according to a driving signal, the conductive pattern being electrically coupled between the input via and the output via.

In an embodiment, the printed circuit board further includes a plurality of heating layers including the heating layer, the heating layers being interposed between the top conductive layer and the bottom conductive layer.

The plurality of heating layers may include a horizontal heating layer including a horizontal conductive pattern, the horizontal conductive pattern including a plurality of conductive traces arranged in substantially parallel lines along a horizontal direction of the printed circuit board and electrically coupled in series between the input via and the output via of the horizontal heating layer by a plurality of connecting traces; a vertical heating layer including a vertical conductive pattern, the vertical conductive pattern including another plurality of conductive traces arranged in substantially parallel lines along a vertical direction of the printed circuit board and electrically coupled in series between the input via and the output via of the vertical heating layer by another plurality of connecting traces, and the horizontal heating layer and the vertical heating layer are arranged so that one of the horizontal heating layer or the vertical heating layer overlaps the other to form a heater grid.

In an embodiment, the printed circuit board further includes a plurality of internal conductive layers for conducting signals when the printed circuit board is in operation, the internal conductive layers being interposed between the top conductive layer and the bottom conductive layer. At least one of the plurality of internal conductive layers may include a solid conductor layer adjacent to the heating layer; the solid conductor layer may be coupled to a conductor pad on one of the top conductive layer or the bottom conductor layer; and the solid conductor layer may be configured to direct a thermal path to the conductor pad.

The internal conductive layers may be interposed between the heater layers and at least one of the top conductive layer and the bottom conductive layer, or the heater layers may be interposed between the internal conductive layers and at least one of the top conductive layer and the bottom conductive layer.

The heater layer may have a heating region and a non-heating region. The conductive pattern may be arranged in the heating region. Each of the top conductive layer and the bottom conductive layer may have a heated region, each heated region may correspond to an area overlapping the heating region, and the heater layer may be configured to direct heat transfer to each of the heated regions.

In an embodiment, the conductive pattern has a high output section and a low output section, the high output section has higher electrical resistance per unit length than the low output section, the high output section is coupled in series with the low output section between the input via and the output via, and the conductive pattern is configured to generate more heat in the high output section than in the low output section.

In an embodiment, the printed circuit board further includes a plurality of conductive patterns on the substrate including the conductive pattern, wherein at least one of the conductive patterns is coupled in parallel with the other conductive patterns between the input via and the output via.

The printed circuit board may further include a via coupling a conductive layer to another conductive layer, wherein the via is interposed between the heater and an electronic component of the electronic components for transferring heat generated by the heater layer to an area adjacent to the electronic component where the via is coupled to.

Aspects of embodiments of the present invention provide a method of heating a printed circuit board, the method including providing a printed circuit board including a top conductive layer; a bottom conductive layer; a plurality of electronic components arranged on at least one of the top conductive layer or the bottom conductive layer; a heater layer interposed between the top conductive layer and the bottom conductive layer; and driving the heater layer to generate and transfer heat to at least one of the electronic components.

The method of may further include providing an external heater driver coupled to the heater layer; supplying a driving signal from the heater driver to a conductive pattern of the heater layer, wherein when the driving signal is applied to the conductive pattern, the conductive pattern generates heat.

Supplying the driving signal from the heater driver to the conductive pattern may include sensing a temperature of the printed circuit board at a first time; if the temperature of the printed circuit board at the first time is below a first reference temperature, supply the driving signal to the conductive pattern; sensing the temperature of the printed circuit board at a periodic interval; and if the temperature of the printed circuit board at the periodic interval is above a second reference temperature, stop supplying the driving signal to the conductive pattern.

In an embodiment, the method further includes if the temperature of the printed circuit board, at either the first time or the periodic interval, is outside of a reference temperature range, prohibiting an operating power from being supplied to the printed circuit board; and if the temperature of the printed circuit board, at either the first time or the periodic interval, is within the reference temperature range, stopping the operation of supplying the driving signal from the heater driver to the conductive pattern and allowing the operating power to be supplied to the printed circuit board.

Aspects of embodiments of the present invention provide for a system for heating a printed circuit board, the system including the printed circuit board including a top conductive layer; a bottom conductive layer; a plurality of electronic components arranged on at least one of the top conductive layer or the bottom conductive layer; a heater layer interposed between the top conductive layer and the bottom conductive layer configured to generate and transfer heat to at least one of the electronic components; a heater driver coupled to the printed circuit board.

The heater driver may include a signal generator for generating a signal to drive the heater layer, and a controller for controlling the signal generator. The signal generator may be coupled to a conductive pattern in the heater layer; the controller may be coupled to a temperature sensor on the printed circuit board; the controller may be configured to receive temperature data from the temperature sensor and to control the signal generator to output the signal according to the received temperature data.

According to aspects of embodiments of the present invention, when electronic components, having a designed operating temperature range, are included on a PCB with the embedded heater, the electronic components may be heated to within their operating temperature, thereby improving operation of the electronic components in certain environments.

Further, according to aspects of embodiments of the present invention, the warm-up period can be decreased, so that it is possible to warm-up the electronic components in a relatively short period of time.

BRIEF DESCRIPTION OF THE DRAWINGS

The accompanying drawings, together with the specification, illustrate exemplary embodiments of the present invention, and together with the description, serve to explain the principles of the present invention.

FIG. 3 is a plan view illustrating a vertical heater layer including a vertical heater circuit of the multilayer printed circuit board shown in FIG. 1.

DETAILED DESCRIPTION

Figure 1:
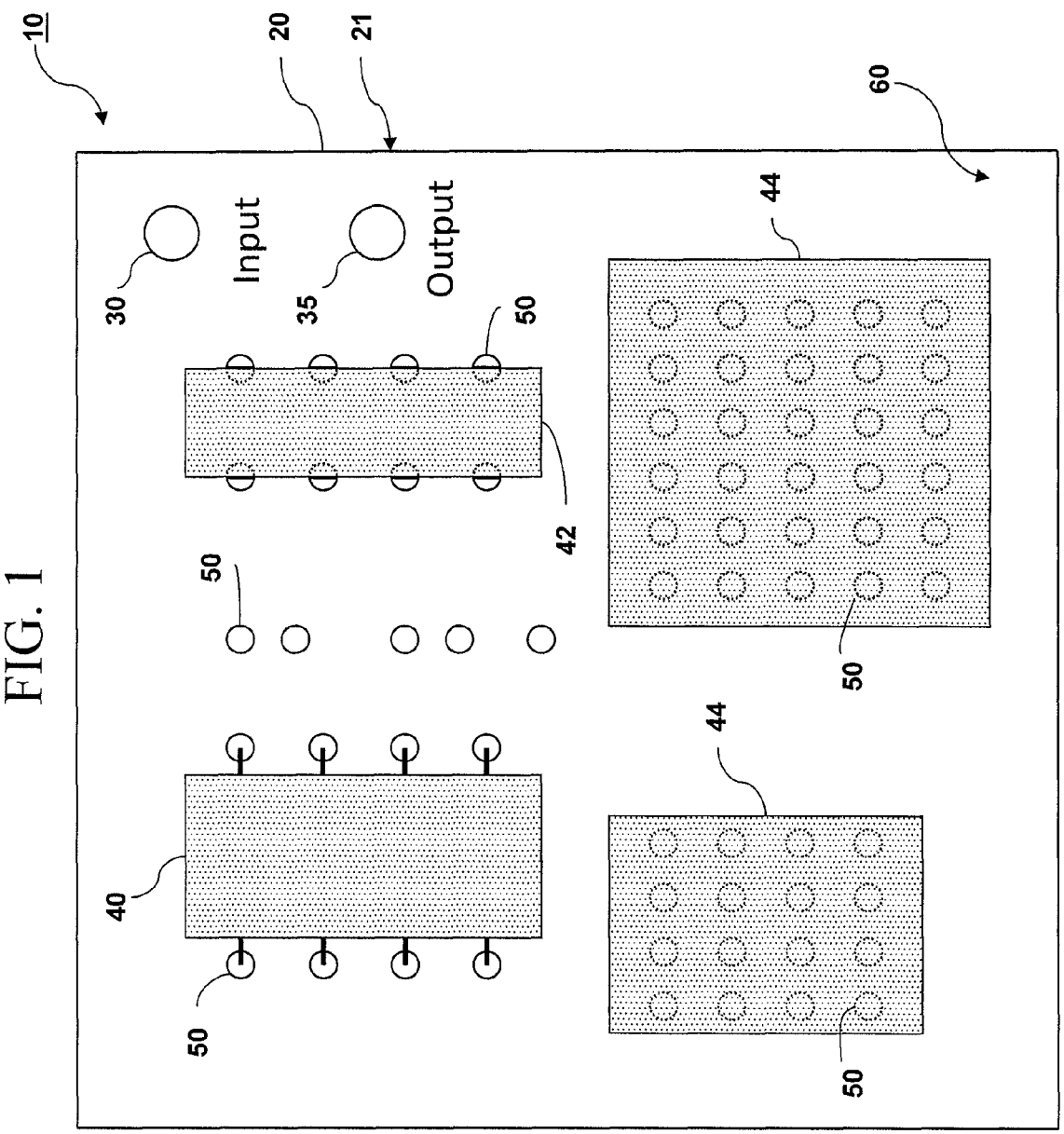
FIG. 1 is a plan view illustrating a top conductive layer of a multilayer printed circuit board according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" or "coupled to" another element, it can be directly "on" or "coupled to" the another element or be indirectly "on" or "coupled to" the another element with one or more intervening elements interposed there between.

Heat generated by current or electricity is an aspect of an embedded heater. In one embodiment the embedded heater includes a heater circuit. Heater circuits (e.g., copper circuits) within a PCB include traces (e.g., copper traces), which generate heat by utilizing Ohm's Law and Watts Law (i.e., the relationship between power, voltage, current, resistance, and watts). The strength of intensity of the current is directly proportional to the voltage and inversely proportional to the resistance. Ohm's Law states the relationship between current, voltage, and resistance. Watt's Law states the relationships of power to current, voltage, and resistance. Power is the amount of current times the voltage level at a given point measured in wattage or watts. Power (P) is the amount of energy given off by a resistance, or load, when current is passed through it, and measured in watts (W). For example, if the current is known to be 2 amps (A), and the resistance is found to be 5 ohms, 2 multiplied by 5 produces 10, i.e., it would take 10 volts (V) to push 2 A through 5 ohms of resistance producing 20 watts of energy.

Traces (e.g., conductive traces or copper traces) of a heater circuit (e.g., a copper circuit) may heat-up or cool down relatively quickly. The flow of current through a trace will cause the temperature of the trace to increase, and an increase in the current will provide additional heat. However, maintaining the current flowing in the trace (or in a portion, e.g., a cross-sectional area, of the trace) at too high a level or for too long a time may cause the trace to fuse (e.g., melt). Additionally, as the temperature of the trace rises, resistance increases, which provides additional power or heat. Concurrent to (or simultaneous to) the time that the current is heating the trace, the trace is dissipating heat through heat transfer, for example by radiation to adjacent layers (e.g., copper layers, ground planes. or signal layers), conduction to adjacent layers or devices (e.g., conduction by vias between layers or conduction by the substrate material through the layers), or convection (e.g., convection to the environment), thus heating the components of the PCB.

In an embodiment, the heater circuits of an embedded heater are on heater layers. The heater layers may be placed between internal layers (e.g., ground planes or solid copper layers) that maintain coupling (e.g., a solid connection) to vias. Examples of vias include thermal vias, ground vias, signal vias, etc. The thermal vias may be solid conductor (e.g., solid copper) vias (e.g., ThermalVias™), and the ground or signal vias may be vias with a conductor layer on their wall (e.g., approximately 0.0012" of copper on the wall). The vias may provide a thermal path (e.g., a thermal path with a relatively improved thermal conductivity as compared to a thermal path through an insulative material, for example, the substrate of a PCB) to portions of the PCB (e.g., component signal pads, ground pads, or ground planes) thus heating up the PCB and components in environments of for example, −60 degrees Celsius (C) or less.

While heater layers have been described as being between internal layers, embodiments of the present invention are not limited thereto, and heater layers may be located at other suitable layers in the PCB. For example, in other embodiments of the present invention, the heater layers may be placed just under the surface layers or in the center of the PCB.

The heater circuits may be on multiple layers (e.g., layers 2-4, layers 2 & 4, etc.) of a multilayer printed circuit board and may be formed into various patterns, for example, a thermal grid (X & Y direction) a serpentine pattern, a multiple output pattern, a localized pattern, etc. One heater layer may include one or a plurality of heater circuits. The heater circuits may be in series or parallel in a single heater layer or in multiple heater layers. For example, heater circuits may be tied together with a resistor or a via.

According to some embodiments, in order to design the embedded heater including the heater circuits, the voltage, current, resistance, and wattage are determined, and a heater circuit configuration (e.g., a serpentine patterned circuit) may be designed. The design may be driven by the trace width or cross-sectional area, space required to carry the required current, or the resistance value that allows the current to flow providing the desired wattage or energy. For example, the trace may vary in length, width, height, pitch, or pattern, according to the designed heat output profile. Also, these trace characteristics may be interdependent, for example, trace width may depend upon available space, current carrying capability, and the resistance required. In one embodiment, the recommended trace width was determined to be about 0.006", an in another embodiment the minimum trace width was determined to be 0.004".

Additionally, the designed heat output profile (or desired wattage or energy) may vary according to the operating environment of the printed circuit board, the required warm up time, the layout of the printed circuit board, the area of the printed circuit board, or the components on the printed circuit board. In one embodiment, total watts may be 20-40 W, depending upon area size. Also, temperature rise can be designed (e.g., predetermined) to meet the application requirements, for example, in one embodiment, a temp rise of 21-30 degrees C. over the ambient temperature may be required. Additionally, the heater circuit may be designed to avoid a relatively excessive temperature rise, which may delaminate the material surrounding the heater (e.g., the substrate of the PCB).

The flow of current to the heater circuit may be supplied by a heater circuit driver. The driver may include a power supply, or may be coupled to a power supply. Additionally, the driver and the power supply may be external to the PCB. In one embodiment of the present invention, a heater driver supplying 28 Volts at 1 amp to an embedded heater resulted in 28 watts of heating power and a temperature rise of 28.5 degrees C. over ambient.

The heater circuits may be designed into a single layer or multiple layers within a PCB during a design and a fabrication process. Fabrication drawing notes may control the resistance value (with a tolerance) of the heater circuits. The resistance required for a desired output (e.g., wattage) for embodiments of embedded heater circuits may be determined according to the following equations: (1) Watts=Amperes$^2$×Ohms; (2) Ro=Ra+(Tc Ra Tr). Where Ro is the operating temperature resistance, Ra is resistance at 20 C, Tc is a temperature coefficient of resistance, and Tr is the temperature rise. Additionally, the length of a trace required to achieve the desired ohms value may be determined by the following equation: L=(Tt Rr Tw)/Ro, where L is the required length, Tt is the trace thickness, Rr is the required resistance, Tw is the trace width, and Ro is the operating temperature resistance.

Certain embodiments will be described in more detail with reference to the accompanying drawings, so that a person having ordinary skill in the art may readily make and use aspects of the present disclosure. Hereinafter, like reference numerals refer to like elements.

FIG. 1 is a plan view illustrating a top conductive layer of a multilayer printed circuit board according to an embodiment of the present invention. A multilayer printed circuit board (PCB) 10 including a multilayer non-conductive substrate 20 is used to mechanically support and electrically couple circuit components using traces on (e.g., etched on) the multilayer non-conductive substrate 20. The circuit components may be mounted onto a top or a bottom surface of the PCB 10, and the circuit components may have an operating temperature range, which the circuit components may be designed to suitably operate within. According to aspects of the present invention, an embedded heater is provided in the PCB 10 to transfer heat to the circuit components so that the temperature of the circuit components is within the suitable operating temperature range. The embedded heater may be configured to transfer heat to the circuit components prior to applying an operating power to the circuit components.

FIG. 1 is illustrated from a top-down perspective and depicts a top conductive layer 60 of the PCB 10. In an embodiment of the present invention, the top conductive layer 60 is an outermost conductive layer of a plurality of layers of the PCB 10. The top conductive layer 60 may be on a top non-conductive substrate 21 of the multilayer non-conductive substrate 20. The top non-conductive substrate 21 may electrically insulate the top conductive layer 60 from adjacent conductive layers and mechanically support the top-conductive layer 60 and a plurality of circuit components. The top conductive layer 60 may include a plurality of traces (e.g., ground or signal traces) formed into circuit patterns for coupling the circuit components or transmitting signals.

The circuit components, for example, a surface mount device (SMD) 40, a through hole device (THD) 42, or a ball grid array (BGA) 44, may be mounted on (e.g., soldered to) the top conductive layer. The top conductive layer 60 may include a plurality of conductive pads (not shown) or a plurality of vias 50 for coupling the circuit components to the circuit traces. For example: the SMD 40 may include a plurality of electrodes which fan out from sides of a body of the SMD over a plurality of corresponding vias 50, and the SMD's electrodes may be coupled to (e.g., soldered to) the corresponding vias 50; the THD 42 may include a plurality of electrodes which extend down from sides of a body of the THD 42 into a plurality of corresponding vias 50, and the THD's electrodes may be coupled to (e.g., soldered to) the corresponding vias 50; or the BGA 44 may include a grid of electrode balls on a bottom of a body of the BGA 44, which are configured to be disposed over a corresponding grid of vias 50, and the BGA's grid of electrode balls may be coupled to (e.g., soldered to) the corresponding grid of vias 50.

Additionally, the vias 50 may be coupled to another layer of the PCB 10 in addition to the top conductive layer 60. For example, the vias 50 may be coupled to a ground plane layer for coupling the circuit components to the ground plane. As another example, the vias 50 may be coupled to another conductive layer for transmitting a signal to the circuit components. The vias 50 may be various suitable vias, including plated vias, solid vias, blind vas, buried vias, micro vias, stacked vias, or combinations thereof.

In one embodiment of the present invention, at least one of the vias 50 is configured to transfer heat (e.g., conduct heat) from another layer to the top conductive layer 60. The via 50 may only be configured to transfer heat, or may be configured both to transfer heat and to conduct a signal depending on the operation mode of the PCB 10.

In one embodiment of the present invention, the vias 50 are configured to transfer heat to the circuit components through the components' electrodes; for example, when the SMD 40 is coupled to vias 50 through electrodes fanning out from its body, heat may be conducted from another layer, through the vias 50, through, the electrodes, to the SMD 40. In another embodiment of the present invention, the vias 50 are configured to transfer heat to the circuit components by conducting, radiating, or convecting heat from underneath the circuit components; for example, when the BGA 44 is disposed above the grid of vias 50, not only may heat be conducted though the electrodes coupled to the vias 50, but also heat may radiate from the vias 50 to the bottom of the BGA 44, heat may transfer by convection to air space around the vias 50 to the bottom of the BGA 50, or heat may transfer to a conductive pattern or substrate underneath the BGA 50, which then may transfer to the BGA 50. While modes of heat transfer have been discussed in connection with example circuit components and example circuit arrangements, these teachings may be applied to other appropriate circuit components or circuit arrangements.

In one embodiment, the embedded heater is coupled to an external heater driver (not shown). The heater driver may be coupled to the embedded heater through an input 30 and an output 35. The input 30 and the output 35 may be, for example, terminals or vias. The external heater driver may include a power supply or be coupled to a power supply. In one embodiment, the heater driver provides the driving current to the embedded heater of the PCB 10. The heater driver may include a heater driver controller which controls the current provided to the embedded heater. The heater driver controller may control the current to correspond to the desired heat output of the embedded heater, the ambient temperature, the temperature of the PCB 10 (or the circuit components of the PCB 10), the current flowing into the embedded heater, or a required heat-up time. The heater driver controller may also control operating power to the board, for example, the heater driver controller could inhibit the application of operating power until the PCB 10 (or the circuit component of the PBC 10) is within its operating temperature. Alternatively, the heater driver controller may visually indicate when the temperature is within the operating temperature, so that the operating power may be manually provided.

As described above, the PCB 10 is a multilayer PCB. That is the PCB 10 may include a plurality of layers laminated in a stack from the bottom conductive layer to the top conducive layer 60, with each consecutive layer disposed over the previous layer. According to aspects of embodiments of the present invention, at least one of the layers includes the embedded heater. For example, the embedded heater may be interposed between the bottom conductive layer and the top conductive layer 60.

Figure 2:
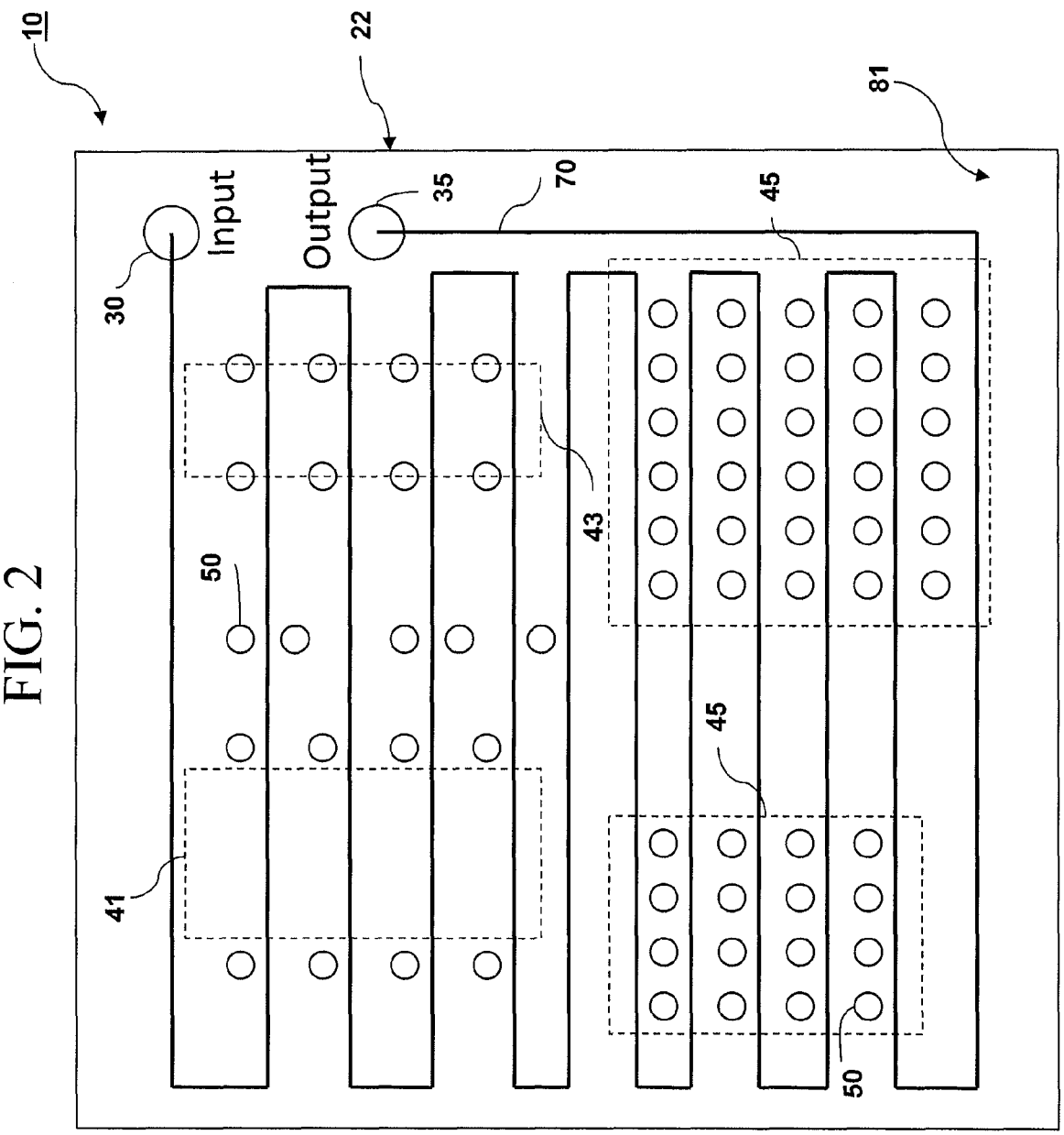
FIG. 2 is a plan view illustrating a horizontal heater layer including a horizontal heater circuit of the multilayer printed circuit board shown in FIG. 1.

Referring now to FIG. 2, FIG. 2 is a plan view illustrating a horizontal heater layer including a horizontal heater circuit of the multilayer printed circuit board shown in FIG. 1. In an embodiment of the present invention, the embedded heater includes a horizontal heater layer 81, the horizontal heater layer being one of the plurality of layers of the PCB 10. The horizontal heater layer 81 may be on a non-conductive substrate 22 of the multilayer non-conductive substrate 20. The non-conductive substrate 22 may electrically insulate the horizontal heater layer 81 from adjacent layers and mechanically support the horizontal heater layer 81. In an embodiment of the present invention, the top-conductive layer 60 and the top non-conductive substrate 21 cover (e.g., overlap or are stacked on top of) the horizontal heater layer 81. The horizontal heater layer 81 is configured to transfer heat to adjacent layers, for example, to the top conductive layer 60 and the circuit components on the top conductive layer 60 (e.g., the SMD 40, the THD 42, or the BGAs 44).

In an embodiment of the present invention, the horizontal heater layer 81 includes a horizontal heater circuit 70. The horizontal heater circuit 70 includes a plurality of traces (e.g., copper traces) formed on (e.g., etched on) the non-conductive substrate 22. The traces of the horizontal heater circuit 70 are arranged into a conductive pattern, for example, the horizontal pattern illustrated in FIG. 2.

In an embodiment of the present invention, the horizontal heater circuit 70 may be formed in a continuous serpentine pattern between the input 30 and the output 35 on the horizontal heater layer 81. For example, the horizontal heater circuit 70 may be formed by disposing a plurality of horizontal traces in substantially parallel lines along a horizontal direction of the printed circuit board, the plurality of traces being spaced apart from each other in direction substantially perpendicular to the horizontal direction (e.g., a vertical direction), disposing a plurality of connecting traces at ends of the traces (e.g., alternating ends) to couple the horizontal traces to each other (e.g., coupled in series), coupling a first horizontal trace to the input 30, and the last horizontal trace to the output 35.

Additionally, the horizontal heater circuit 70 may be formed at regions of the horizontal heater layer 81 which correspond to areas under the circuit components. For example, traces of the horizontal heater circuit may be disposed on the non conductive substrate 22 at an area under the SMD 41, an area under the THD 43, or an area under the BGA 45.

When a current is supplied to the horizontal heater circuit 70 (e.g., when an voltage is supplied across the input 30 and the output 35), the current flows from input 30, through the traces of the horizontal heater circuit 70, to the output 35, thereby generating heat (e.g., the temperature of the traces increase due to, for example, an increase in resistance). The heat generated by the horizontal heater circuit 70 may then transfer (e.g., dissipate, conduct, or radiate) to adjacent elements of the PCB 10. For example, the heat may radiate from the traces to the material directly adjacent to the horizontal heater layer 81 (e.g., the top conductive layer 60), or may conduct heat to the surrounding materials. Vias 50 arranged adjacent to the horizontal heater circuit 70 may enhance (e.g., improve compared to arrangements without a via) the heat transfer to adjacent layers or components.

Because traces of the horizontal heater circuit 70 may be disposed at an area directly under the circuit components (e.g., at the areas 41, 43, or 45 of the horizontal heater layer 81), heat transfer may be directed at (or focused) on the circuit components (e.g., the SMD 40, the THD 42, or the BGAs 44).

Referring now to FIG. 3, FIG. 3 is a plan view illustrating a vertical heater layer including a vertical heater circuit of the multilayer printed circuit board shown in FIG. 1. In an embodiment of the present invention, the embedded heater includes a vertical heater layer 82, the vertical heater layer being one of the plurality of layers of the PCB 10. The vertical heater layer 82 may be on a non-conductive substrate 23 of the multilayer non-conductive substrate 20. The non-conductive substrate 23 may electrically insulate the vertical heater layer 82 from adjacent layers and mechanically support the vertical heater layer 82. In an embodiment of the present invention, the top-conductive layer 60 and the top non-conductive substrate 21 cover (e.g., overlap or are stacked on top of) the vertical heater layer 82. The vertical heater layer 82 is configured to transfer heat to adjacent layers, for example, to the top conductive layer 60 and the circuit components on the top conductive layer 60.

In an embodiment of the present invention, the vertical heater layer 82 includes a vertical heater circuit 71. The vertical heater circuit 71 includes a plurality of traces formed on the non-conductive substrate 23. The traces of the vertical heater circuit 71 are arranged into a conductive pattern, for example, the vertical pattern illustrated in FIG. 3.

In an embodiment of the present invention, the vertical heater circuit 71 may be formed in a continuous serpentine pattern between the input 30 and the output 35 on the vertical heater layer 82. For example, the vertical heater circuit 71 may be formed by disposing a plurality of vertical traces in substantially parallel lines along a vertical direction of the printed circuit board, the plurality of traces being spaced a part from each other in direction substantially perpendicular to the vertical direction (e.g., the horizontal direction), disposing a plurality of connecting traces at ends of the traces (e.g., alternating ends) to couple the vertical traces to each other (e.g., coupled in series), coupling a first vertical trace to the input 30, and the last vertical trace to the output 35.

When a current is supplied to the vertical heater circuit 71, the current flows from input 30, through the traces of the vertical heater circuit 70, to the output 35, thereby generating heat. The heat generated by the vertical heater circuit 71 may then transfer to adjacent elements of the PCB 10. Vias 50 arranged adjacent to the horizontal heater circuit 70 may enhance the heat transfer to adjacent layers or components.

Figure 4A:
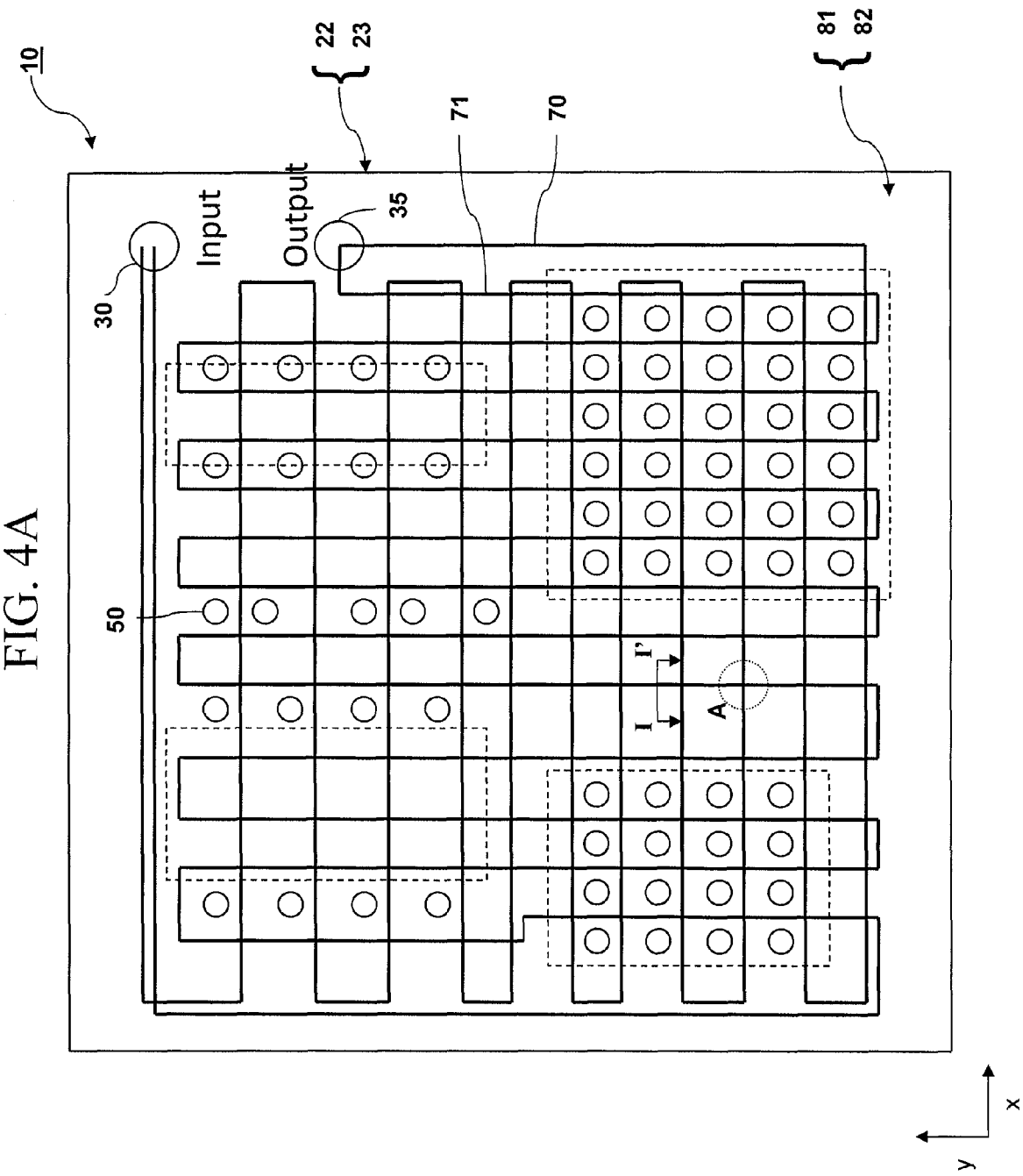
FIG. 4A is a plan view illustrating a plurality of heater layers of the multilayer printed circuit board shown in FIG. 1 arranged to provide a thermal grid.
Figure 4B:
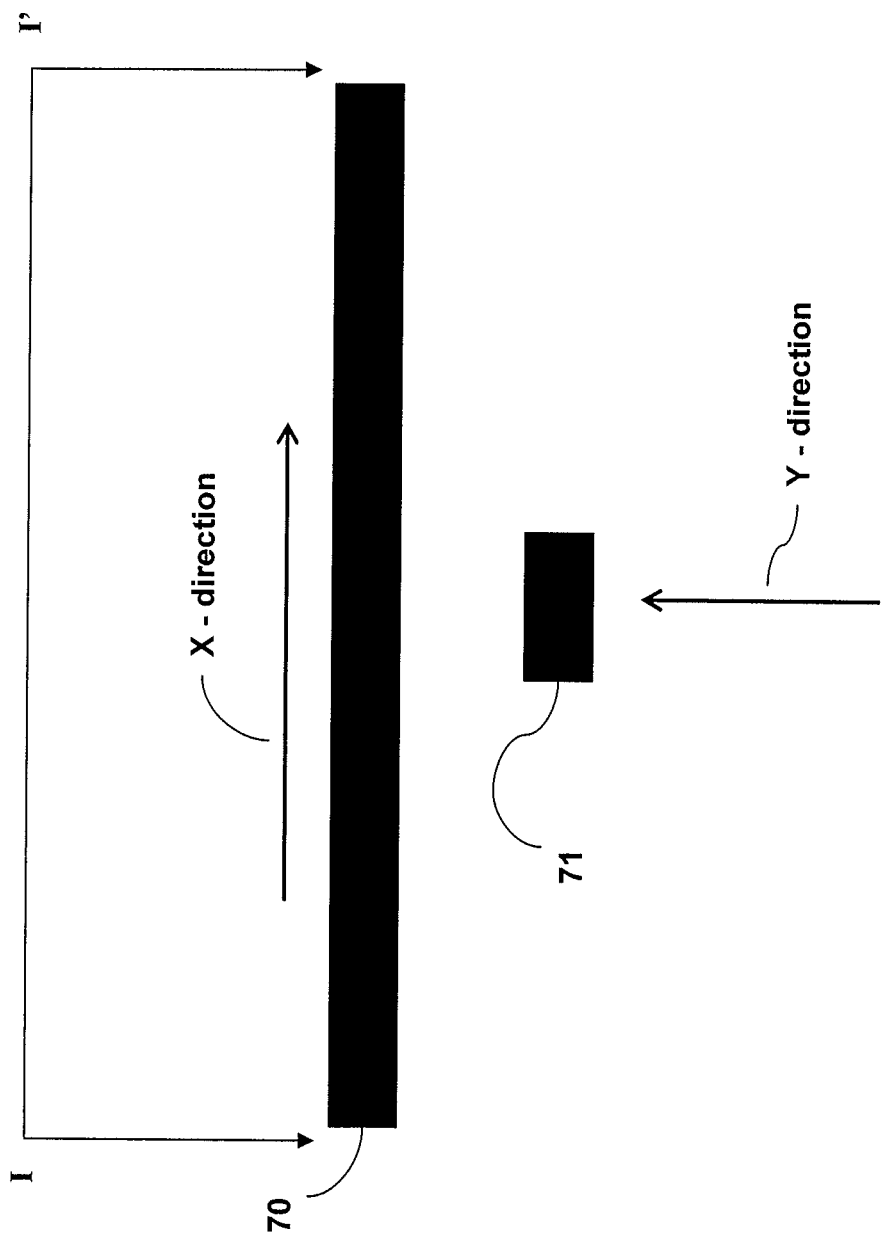
FIG. 4B is an illustration of a cross-sectional view taken along the line I-I' in FIG. 4A.
Figure 4C:
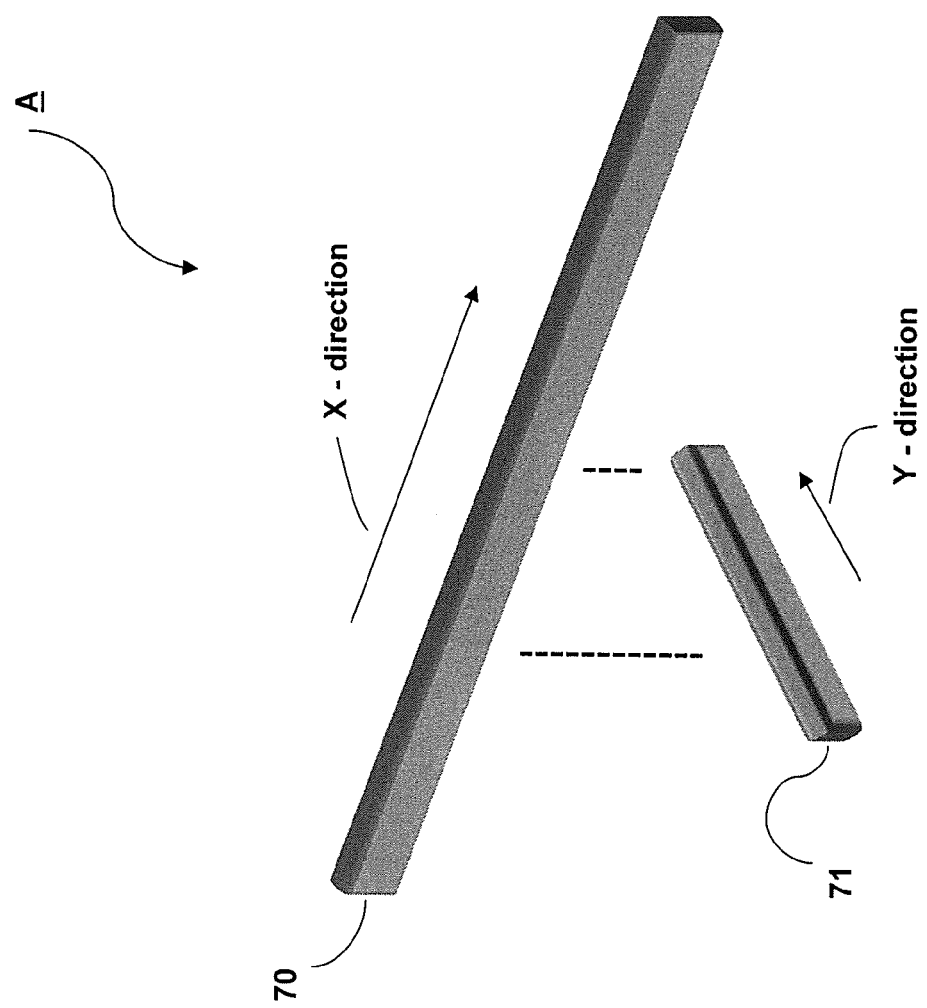
FIG. 4C is an illustration of an exploded view of the region A in FIG. 4A.

A multilayer printed circuit board including an embedded heater according to another embodiment of the present invention will be described with reference to FIGS. 4A, 4B, and 4C. FIG. 4A is a plan view illustrating a plurality of heater layers of the multilayer printed circuit board shown in FIG. 1 arranged to provide a thermal grid. FIG. 4B is an illustration of a cross-sectional view taken along the line I-I' in FIG. 4A. FIG. 4C is an illustration of an exploded view of the region A in FIG. 4A.

With reference to FIGS. 4A, 4B, and 4C, since an embedded heater according to the present embodiment of the present invention may include the same (or substantially the same) structure as those described in connection to FIGS. 2 and 3, descriptions of certain aspects of the embedded heater are given by way of reference to the above descriptions and will not be described in detail herein.

While embodiments of the present invention have been described as having an embedded heater including one heater layer, the present invention is not limited thereto, and the embedded heater may include a plurality of heater layers. For example, the embedded heater of the PCB 10 illustrated in FIG. 4A includes two heater layers, the horizontal heater layer 81 and the vertical heater layer 82.

In one embodiment of the present invention, the horizontal heater layer 81 may be disposed adjacent to the vertical heater layer 82 (e.g., formed on top or bottom) so as to form a thermal grid. By arranging the heater layers 81 and 82 in a thermal grid, the heat transfer to the circuit components may be improved, for example, the heat up time of the circuit components may be decreased or the heat profile (e.g., the level of heat transfer per cross-sectional unit area) may be made more uniform across a plane of the PCB 10 as compared to a PCB with only one of the heater layers 81 or 82.

While the heater layers 81 and 82 may be formed one on top of the other, their heater circuits 70 and 71 may be spaced apart (or insulated) from each other, for example, spaced apart by an interposing non-conductive layer (e.g., the non-conductive substrate 22 or 23). Referring now to FIGS. 4B and 4C. FIG. 4B illustrates a cross section along a line I-I' of FIG. 4A. FIG. 4C illustrates an exploded view of the area A of FIG. 4A. Both FIGS. 4B and 4C illustrate that, while segments of the heater circuits 71 and 72 may overlap, they may also be spaced apart from each other so as not to intersect or couple at the regions in which they overlap.

However, while the heater circuits 71 and 72 may not be coupled together at the overlapping regions, the heater circuits 71 and 72 may nonetheless be coupled together. For example, the horizontal heater circuit 71 and the vertical heater circuit 72 may be coupled together at the input 30 or the output 35, but the present invention is not limited thereto, and the heater circuits 71 and 72 otherwise be coupled together, for example, by a resistor.

Figure 5:
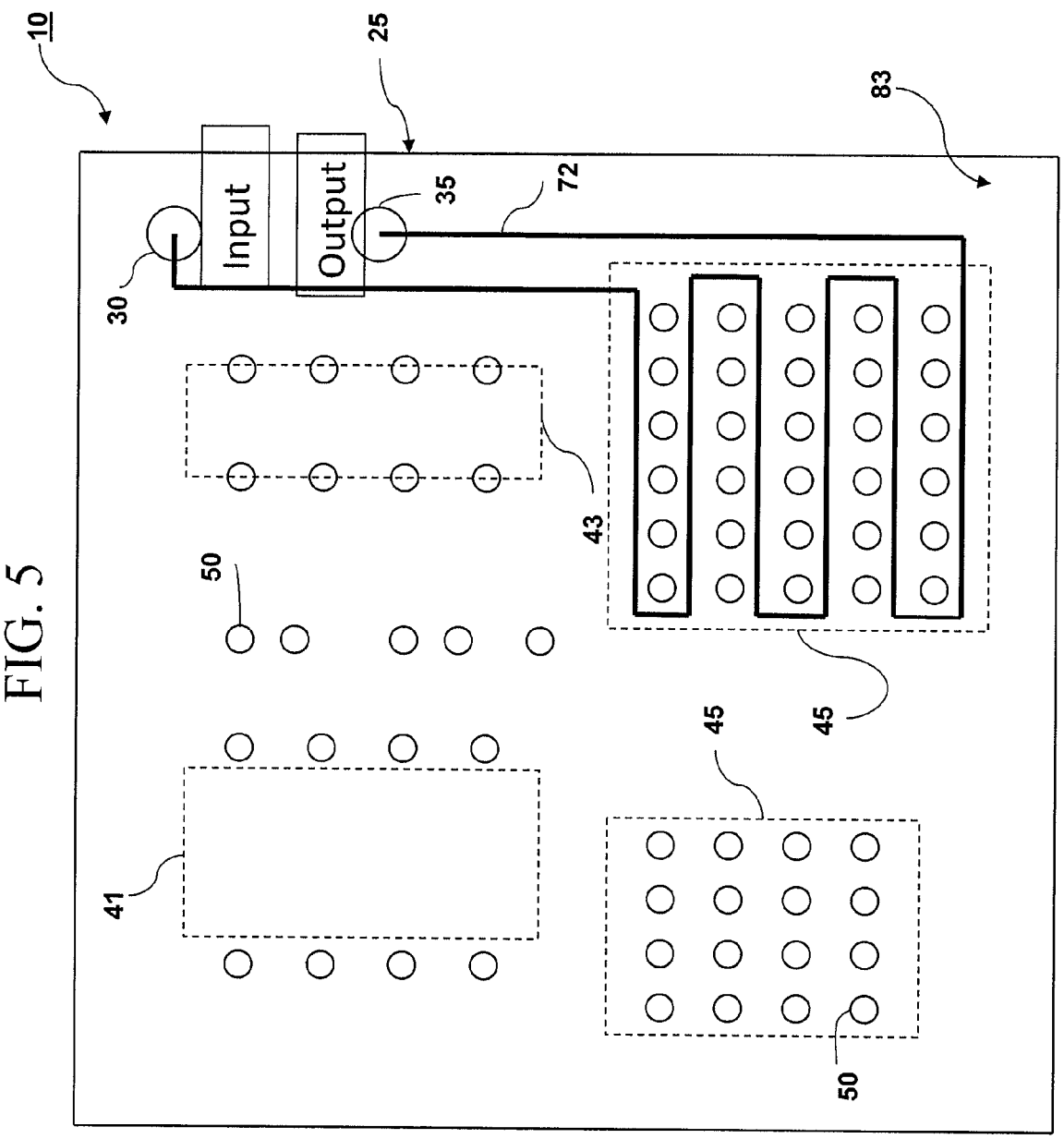
FIG. 5. is a plan view illustrating a localized heater layer including a localized heater circuit of the multilayer printed circuit board shown in FIG. 1.

A multilayer printed circuit board including an embedded heater according to another embodiment of the present invention will be described with reference to FIG. 5. FIG. 5 is a plan view illustrating a localized heater layer including a localized heater circuit of the multilayer printed circuit board shown in FIG. 1.

In an embodiment of the present invention, the embedded heater includes a localized heater layer 83, the localized heater layer being one of the plurality of layers of the PCB 10. The localized heater layer 83 may be on a non-conductive substrate 25 of the multilayer non-conductive substrate 20. The non-conductive substrate 25 may electrically insulate the localized heater layer 83 from adjacent layers and mechanically support the localized heater layer 83. In an embodiment of the present invention, the top-conductive layer 60 and the top non-conductive substrate 21 cover the localized heater layer 83. The localized heater layer 83 is configured to direct heat transfer to (or concentrate heat at) a specific region of the adjacent layers, for example, to a specific circuit component on the top conductive layer 60 (e.g., the SMD 40, the THD 42, or the BGAs 44).

In an embodiment of the present invention, the localized heater layer 83 includes a localized heater circuit 72. The localized heater circuit 72 includes a plurality of traces formed on the non-conductive substrate 25. The traces of the localized heater circuit 72 are arranged into a conductive pattern. In an embodiment of the present invention, the localized heater circuit 72 may be formed in a continuous serpentine pattern between the input 30 and the output 35 on the localized heater layer 83. When a current is supplied to the localized heater circuit 72, the current flows from the input 30, through the traces of the localized heater circuit 72, to the output 35, thereby generating heat. The heat generated by the localized heater circuit 72 may then transfer to adjacent elements of the PCB 10.

Because traces of the localized heater circuit 72 are primarily disposed (or concentrated at) a specific region of the PCB 10, the localized heater circuit 72 is configured to target heat transfer to a target region of the PCB 10, for example, the target region under a target circuit component. In the embodiment illustrated in FIG. 5, the localized heater circuit is formed primarily at a region corresponding to the area under the BGA 45. For example, the conductive pattern may not be arranged (or substantially not arranged) in the non-heating region. Accordingly, the localized heater circuit 72 embodied in FIG. 5 is configured to target its generated heat at the BGA 44 on the top conducting layer 60.

When it is necessary to only heat up a portion of the PCB 10 (e.g., a specific circuit component), the localized heater layer 83 may be used to efficiently heat up that portion. Additionally, when a portion of the PCB 10 requires more heat (or a higher rate of heat transfer) the localized heater layer 83 may be used in conjunction with other layers to increase the heat output profile (or the heat transfer rate) in that region as compared to other regions of the PCB 10.

Figure 6:
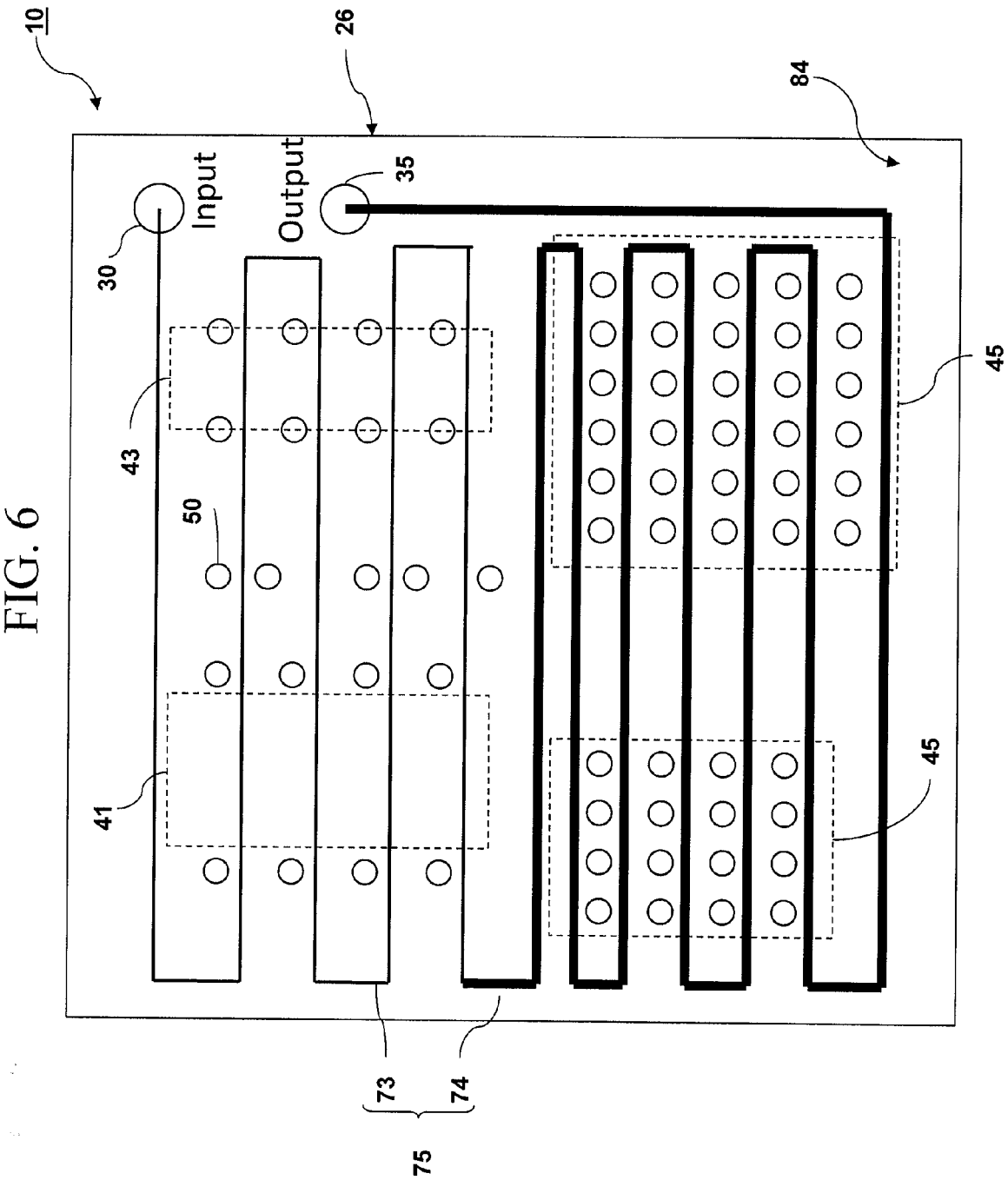
FIG. 6 is a plan view illustrating a multiple-output heater layer including a multiple-output heater circuit of the multilayer printed circuit board shown in FIG. 1.

A multilayer printed circuit board including an embedded heater according to another embodiment of the present invention will be described with reference to FIG. 6. FIG. 6 is a plan view illustrating a multiple-output heater layer including a multiple-output heater circuit of the multilayer printed circuit board shown in FIG. 1. With reference to FIG. 6, since an embedded heater according to the present embodiment of the present invention may include the same (or substantially the same) structure as the embedded heater described in connection to FIG. 2, descriptions of certain aspects of the embedded heater are given by way of reference to the above descriptions and will not be described in detail herein.

In an embodiment of the present invention, the embedded heater includes a multiple-output heater layer 84, which includes a multiple-output heater circuit 75. The multiple-output heater circuit 75 includes a plurality of traces formed on a non-conductive substrate 26 of the multilayer non-conductive substrate 20. The traces of the multiple-output heater circuit 75 are arranged into a conductive pattern. In an embodiment of the present invention, the multiple-output heater circuit 75 may be formed in a continuous serpentine pattern between the input 30 and the output 35 on the multiple-output heater layer 84. The multiple output heater circuit 75 may comprise a plurality of output portions, for example, a high output portion 73 and a low output portion 75, coupled together (e.g., coupled in series). The high output portion 73 is configured to have a higher resistance per unit-length than the low output portion 74. The resistance of the portions may be controlled by, for example, varying the width, thickness, or composition of the traces in the portions.

When a current is supplied to the multiple-output heater circuit 75, the current flows from the input 30, through the traces of the multiple-output heater circuit 75, to the output 35, thereby generating heat. The heat generated by the multiple-output heater circuit 75 may then transfer to adjacent elements of the PCB 10. Additionally, because the high output portion 73 has a higher resistance per unit-length, the high output portion generates more heat than the low output portion 74. Accordingly, the multiple-output heater layer 84, may be used when a portion of the PCB 10 (e.g., only some of the circuit components) requires more heat (or a higher rate of heat transfer) than another portion. That is, the PCB 10 including the multiple-output heater layer 84 has a heat output profile which is non-uniform and greater at regions of the PCB 10 corresponding to the high output portion 73 of the multiple-output heater circuit 75.

While the preceding embodiments have described the heater circuit as being in serpentine patterns, the present invention is not limited thereto, and the heater circuit may be in various patterns. For example, the heater circuit may be a solid copper plate, lines, grid, circular, zigzag, or combinations thereof.

In addition to the arrangement or layout of a heater circuit on a heater layer, the location of the heater layer (or heater layers) within the PCB, as well as the arrangement of layers or components of the PCB adjacent to the heater layer (or layers) may be adjusted to effect the heat output profile (or rate of heat transfer per geometric region). For example, the heater circuit may be configured to heat up plane layers or solid copper layers of the PCB. Further, the heater circuit may be configured to generate heat that travels to the surface utilizing the ground or the thermal vias to heat up the components. FIGS. 7-11 illustrate several embodiments of the present invention with various arrangements of layers and components within the PCB.

Figure 7:
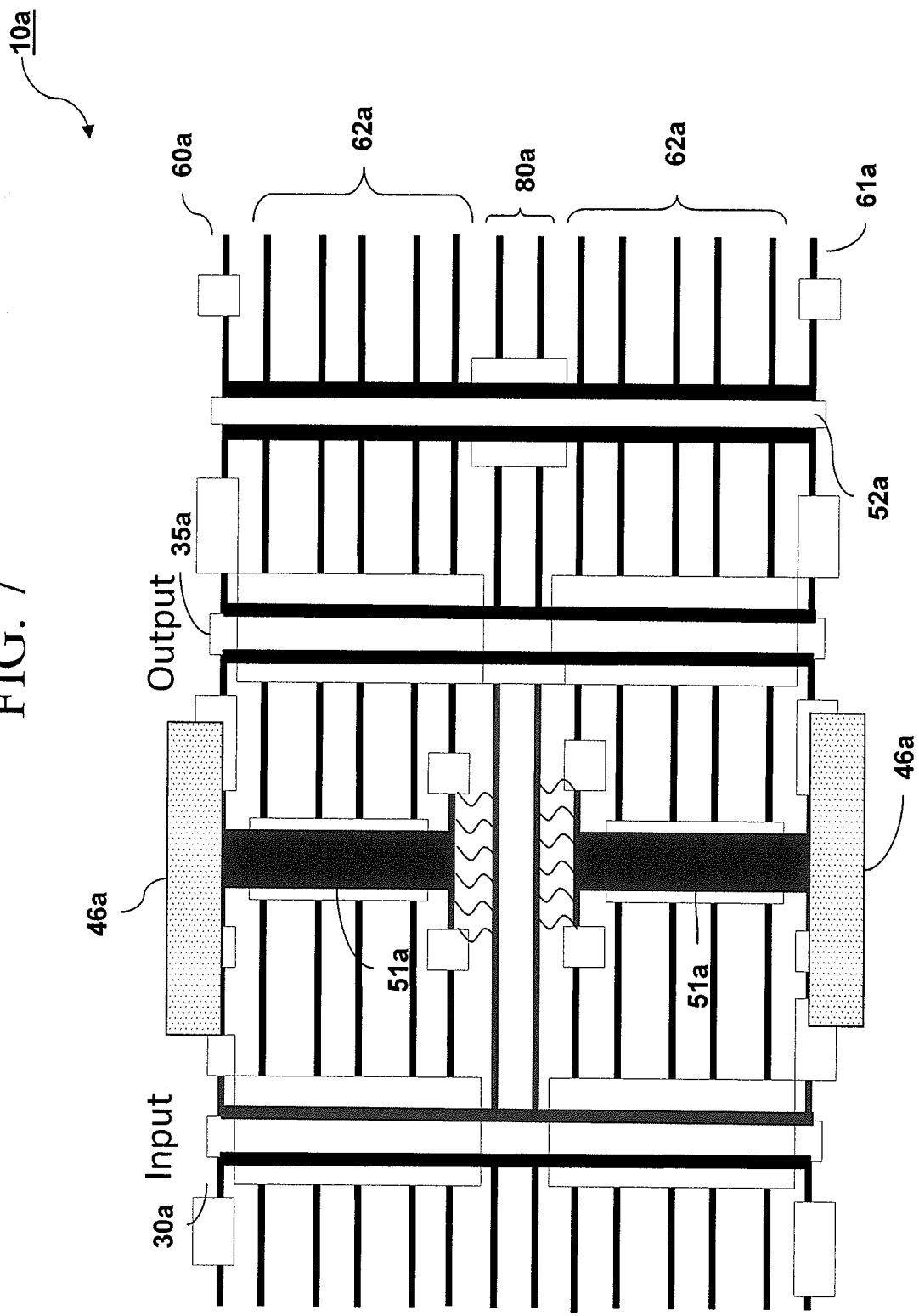
FIG. 7 is a partial cross-sectional view illustrating a multilayer printed circuit board including heater layers and solid blind vias according to an embodiment of the present invention.

Referring to FIG. 7, FIG. 7 is a partial cross-sectional view illustrating a multilayer printed circuit board including heater layers and solid blind vias according to an embodiment of the present invention.

A multilayer printed circuit board (PCB) 10a according to an embodiment of the present invention includes a plurality of layers disposed on a multilayer non-conductive substrate (not shown). The plurality of layers may be formed in a laminated structure, that is one layer stacked on top of another. The PCB 10a includes a top conductive layer 61a, which has a circuit component 46a disposed on a surface (e.g., an external surface) thereof and coupled to a conductive pattern of the top conductive layer 60a. The PCB 10a may also include a bottom conductive layer 61a, which may have another circuit component 46a disposed on a surface thereof and coupled to a conductive pattern on the bottom conductive layer 61a. The top conductive layer 60a and the bottom conductive layer are at opposite ends of the laminate stack of layers of the PCB 10a. The circuit components 46a may have an operating temperature range, which is a range in which the circuit components 46a are designed to operate within.

The PCB 10a may include a plurality of heater layers 80a interposed between the top conductive layer 60a and the bottom conductive layer 61b. The heater layers 80a are configured to generate and transfer heat to adjacent layers and components when supplied with a driving current. For example, the heater layers 80a are configured to transfer heat to the circuit components 46a to heat them within the operating temperature range. The heater layers 80a may each include a heater circuit or multiple heater circuits. Furthermore, the heater circuits may be connected in series, parallel or combinations thereof on a single layer, or across multiple layers.

The heater layers 80a may be connected to a heater driver through an input 30a and an output 35a. The input 30a and the output 35a may be vias, or another suitable PCB component capable of conducting a heater driving current to the heater layers 80a.

The PCB 10a may include a plurality of internal conductive layers 62a. The internal conductive layers are interposed between the top conductive layer 60a and the bottom conductive layer 61a. The internal conducive layers 62a may have various different configurations, for example an internal conductive layer 62a may be configured to transmit signals from one area of the PCB 10a to another area, and another internal conductive layer 62a may be configured as a plane layer (e.g., a ground plane). The internal conductive layers 62a may be designed to transmit signals when the PCB 10a is in a normal operation (e.g. a powered operating mode other than a heating operation), and may not be specifically designed to generate or facilitate heat transfer during the heating operation (but in some embodiments may, nevertheless, incidentally generate or facilitate heat transfer during the heating operation).

The internal conductive layers 62a may be interposed between the heater layers 80a and the top conductive layer 60a or the bottom conductive layer 60a. Heat generated by the heater layers 80a may propagate by heat transfer (conduction, radiation, or convection) through the internal conducive layers 62a, to the top or bottom conductive layers 60a or 61a, to the circuit components 46a, and out to the external surroundings of the PCB 10a. Thereby raising the temperature of the circuit components 46a to within the operating temperature range.

The PCB 10a may include a plurality of vias. Some vias may be configured primarily to conduct signals between layers during a powered operation of the PCB 10a, and others may be configured to primarily conduct heat between layers during a heating operation of the PCB 10a. However, regardless of the via's configuration, all vias may enhance heat transfer (e.g., increase heat transfer as compared to an embodiment without the via) between layers because the vias generally have a better thermal conductivity than the adjacent substrate material.

The PCB 10a may include a plated via 52a. The plated via has a conductive plating on its wall. For example, in one embodiment, the plated via 52a has 0.0012" of copper platted on its wall. In one embodiment, the plated via 52a may couple together portions of the top, bottom, and internal conductive layers 60a, 61a, and 62a, and pass through, but not be coupled to, the heater layers 80a. When the heater layer is generating heat, the plated via 52a may assist in transferring heat to the portions of the conductive layers 60a, 61a, and 62a that the plated via 52a is coupled to.

The PCB 10a may include solid blind vias 51a. The solid blind vias have a solid conductive core (e.g., a solid copper core) and may terminate at an internal layer of the PCB 10a. The solid blind via may be a thermal via (e.g., ThermalVias™). The solid conductor core improves heat transfer efficiency as compared to a via with a plated conductor wall. In an embodiment, the solid blind vias 51a couple a layer directly adjacent to a heater layer 80a with a portion of the top or bottom conductive layer 60a, 61a directly under a circuit component 46a. When the heater layers 80a generate heat, the heat may transfer to the adjacent layer (e.g., may radiate to an end of the solid blind via 51a), through the solid blind vias 51a, to the areas under the circuit components 46a, thus heating up the circuit components 46a. In this way, heat generated at the heater layers 80a may be efficiently directed to the circuit components 46a.

Figure 8:
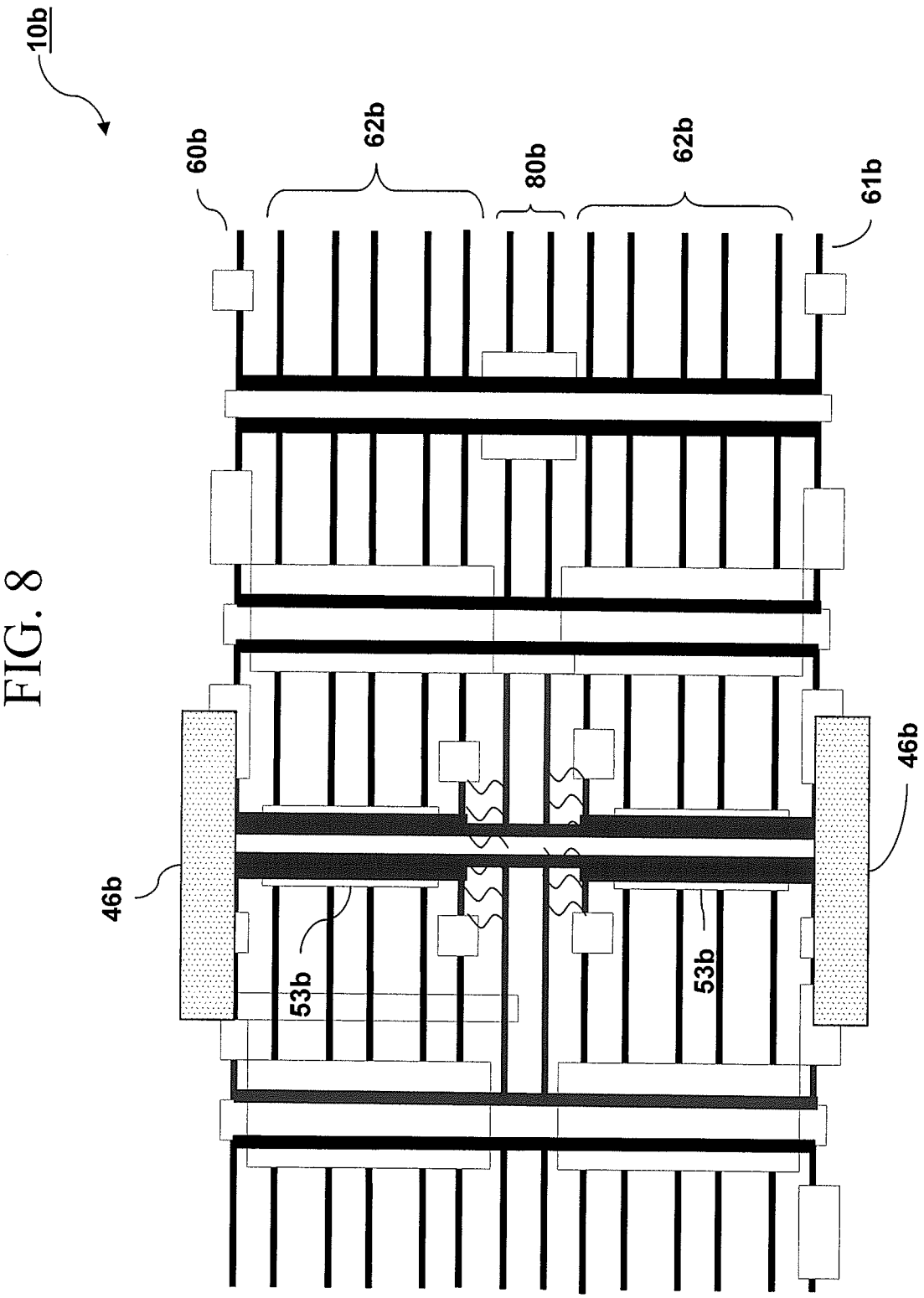
FIG. 8 is a partial cross-sectional view illustrating a multilayer printed circuit board including heater layers and blind vias according to an embodiment of the present invention.

In another embodiment of the present invention, the printed circuit board may include blind vias interposed between a heater layer and a circuit component. In reference to FIG. 8, FIG. 8 is a cross-sectional view illustrating a multilayer printed circuit board including heater layers and blind vias according to an embodiment of the present invention. Since the PCB according to the present embodiment may include the same (or substantially the same) elements as previously described embodiments, descriptions of certain aspects of the present embodiment are given by way of reference to the above descriptions and will not be described in detail herein.

A PCB 10b is similar to the PCB 10a except that the PCB 10b includes blind vias 53b instead of solid blind vias 51a. The blind vias 53b have a plated conductor wall. The blind vias 53b couple a top conductive layer 60b or a bottom conductive layer 61b to an internal layer of the internal layers 62b. The blind vias 53b may be interposed between a heater layer 80b and a circuit component 46b, and may be configured to transfer heat generated by the heater layers 80b to the circuit components 46b.

Because the blind vias 53b have a plated conductor wall instead of a solid conductor wall, the blind vias 53b transfer heat to a lesser degree than the similarly situated solid blind vias 51a. Therefore, the blind via 53a may be used, for example, when a lesser rate of heat transfer is required, for example when a higher rate may damage a component or delaminate the PCB 10b.

Figure 9:
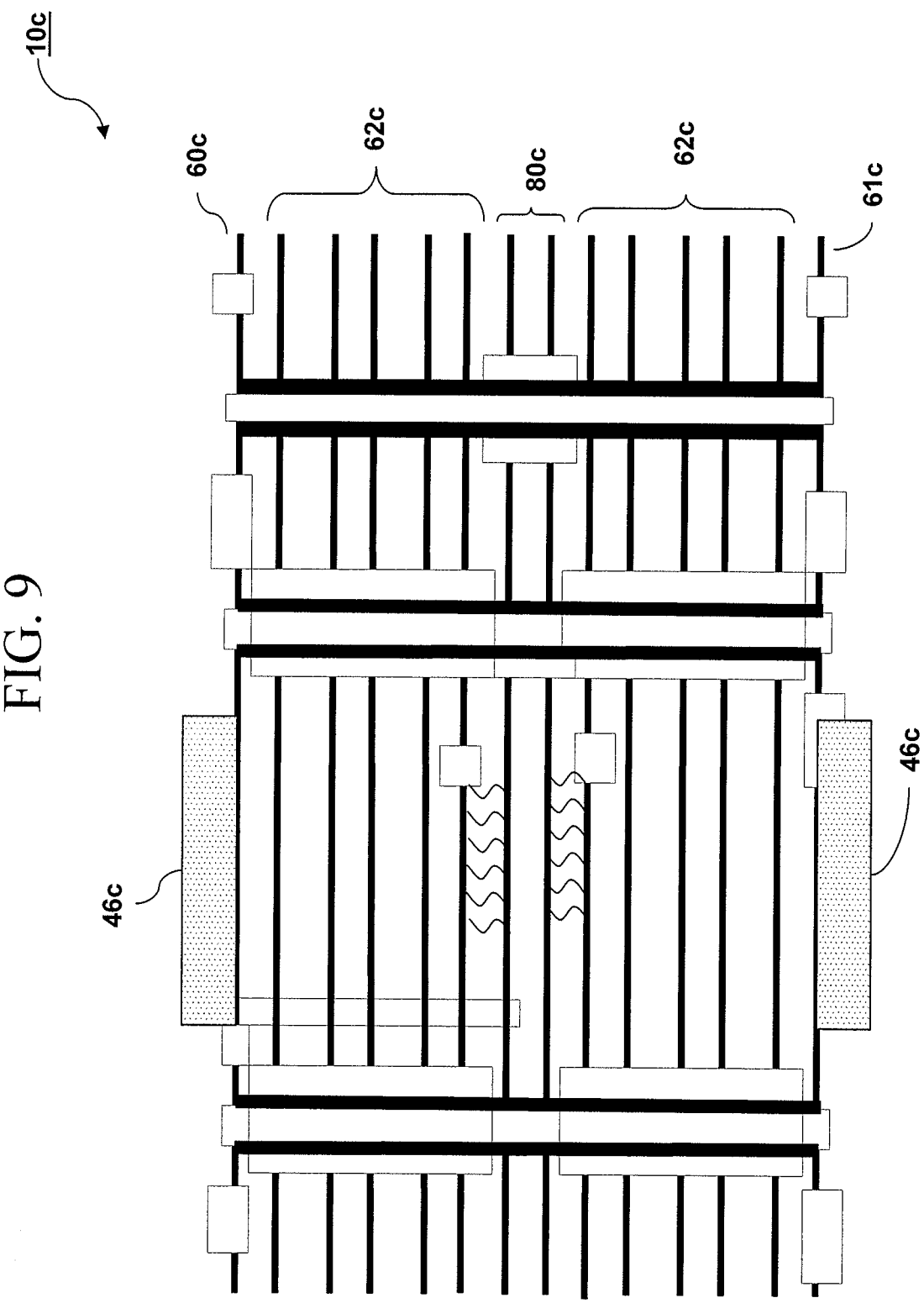
FIG. 9 is a partial cross-sectional view illustrating a multilayer printed circuit board without blind vias and including heater layers according to an embodiment of the present invention.

In another embodiment of the present invention, the printed circuit board may not include vias interposed between a heater layer and a circuit component. In reference to FIG. 9, FIG. 9 is a cross-sectional view illustrating a multilayer printed circuit board without blind vias and including heater layers according to an embodiment of the present invention. Since the PCB according to the present embodiment may include the same (or substantially the same) elements as previously described embodiments, descriptions of certain aspects of the present embodiment are given by way of reference to the above descriptions and will not be described in detail herein.

A PCB 10c is similar to the PCB 10b except that the PCB 10c may not have a via interposed between heater layers 80c and circuit components 46c. When the heater layers 80c generate heat, the heat transfers through the internal conductive layers 62c, to the top or bottom conductive layers 60c, 61c, to the circuit components 46c, thereby heating up the circuit components 46c to within the operating temperature range.

Figure 10:
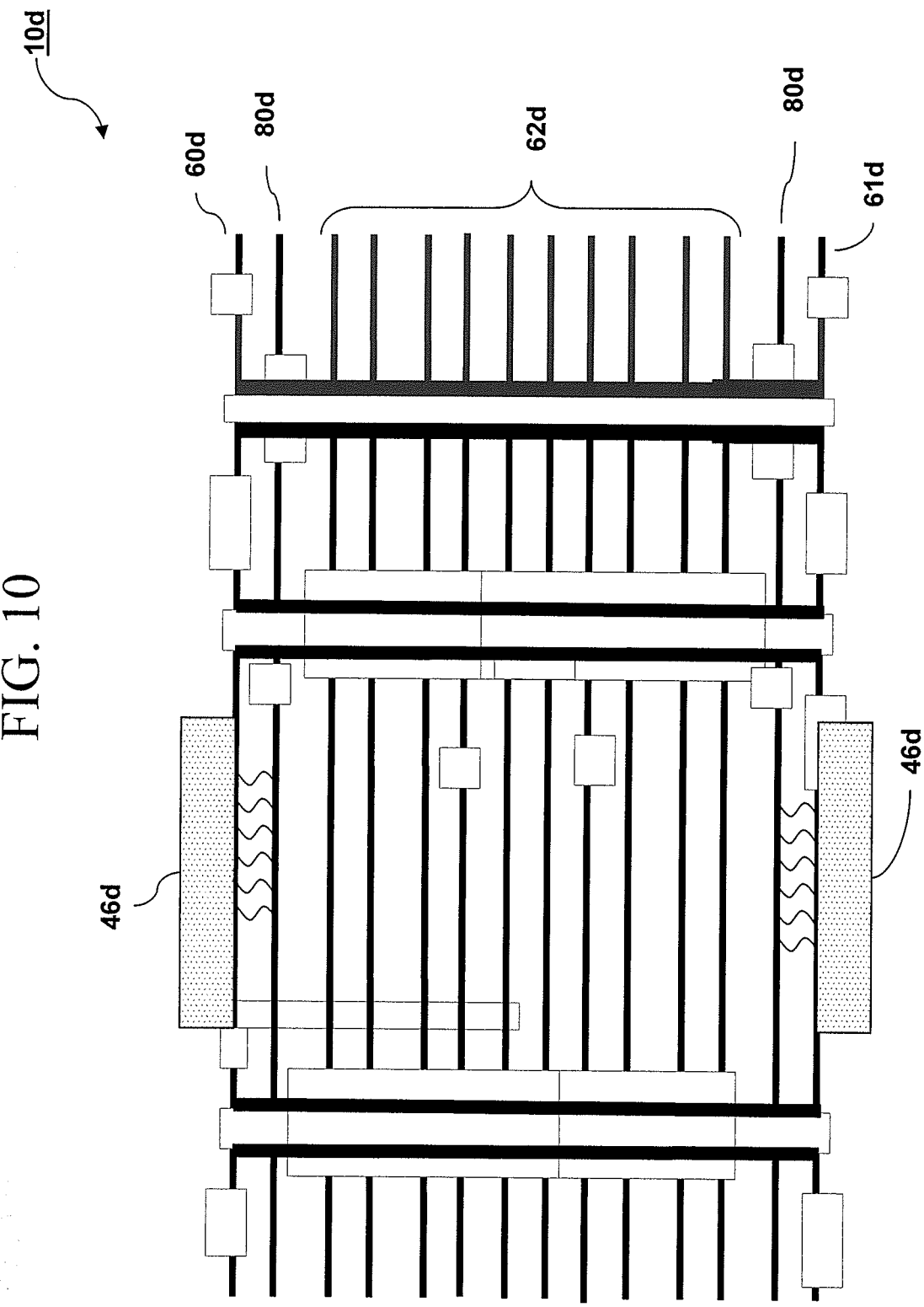
FIG. 10 is a partial cross-sectional view illustrating a multilayer printed circuit board including heater layers near top and bottom layers of the printed circuit board according to an embodiment of the present invention.

In another embodiment of the present invention, the printed circuit board may include heater layers adjacent to the outer conductive layers. In reference to FIG. 10, FIG. 10 is a cross-sectional view illustrating a multilayer printed circuit board including heater layers near top and bottom layers of the printed circuit board according to an embodiment of the present invention. Since the PCB according to the present embodiment may include the same (or substantially the same) elements as previously described embodiments, descriptions of certain aspects of the present embodiment are given by way of reference to the above descriptions and will not be described in detail herein.

While previous embodiments were described as having heater layers disposed at or near the center of the printed circuit board or having internal conductive layers interposed between the heater layers and the printed circuit board, embodiments of the present invention are not limited thereto and may include other placements of heater layers. For each additional heater layer, the heat profile of the printed circuit board may be adjusted, for example, heat generation may be increased in a particular area or throughout the printed circuit board.

For example, a PCB 10b includes a heater layer 80d directly adjacent (e.g., under) a top conductive layer 60d, and another heater layer 80d directly adjacent (e.g., above) a bottom conductive layer 61d. The PCB 10b may further include internal conductive layers 62d interposed between heater layers 80d. When the heater layers 80d are formed directly adjacent to top and bottom conductive layers 60d, 61d, the heat generated by the heater layers 80d may be directly transferred to the top or bottom conductive layers 69d, 61d, and thereby to circuit components 46d mounted thereon, without first transferring through other elements of the PCB 10b.

Figure 11:
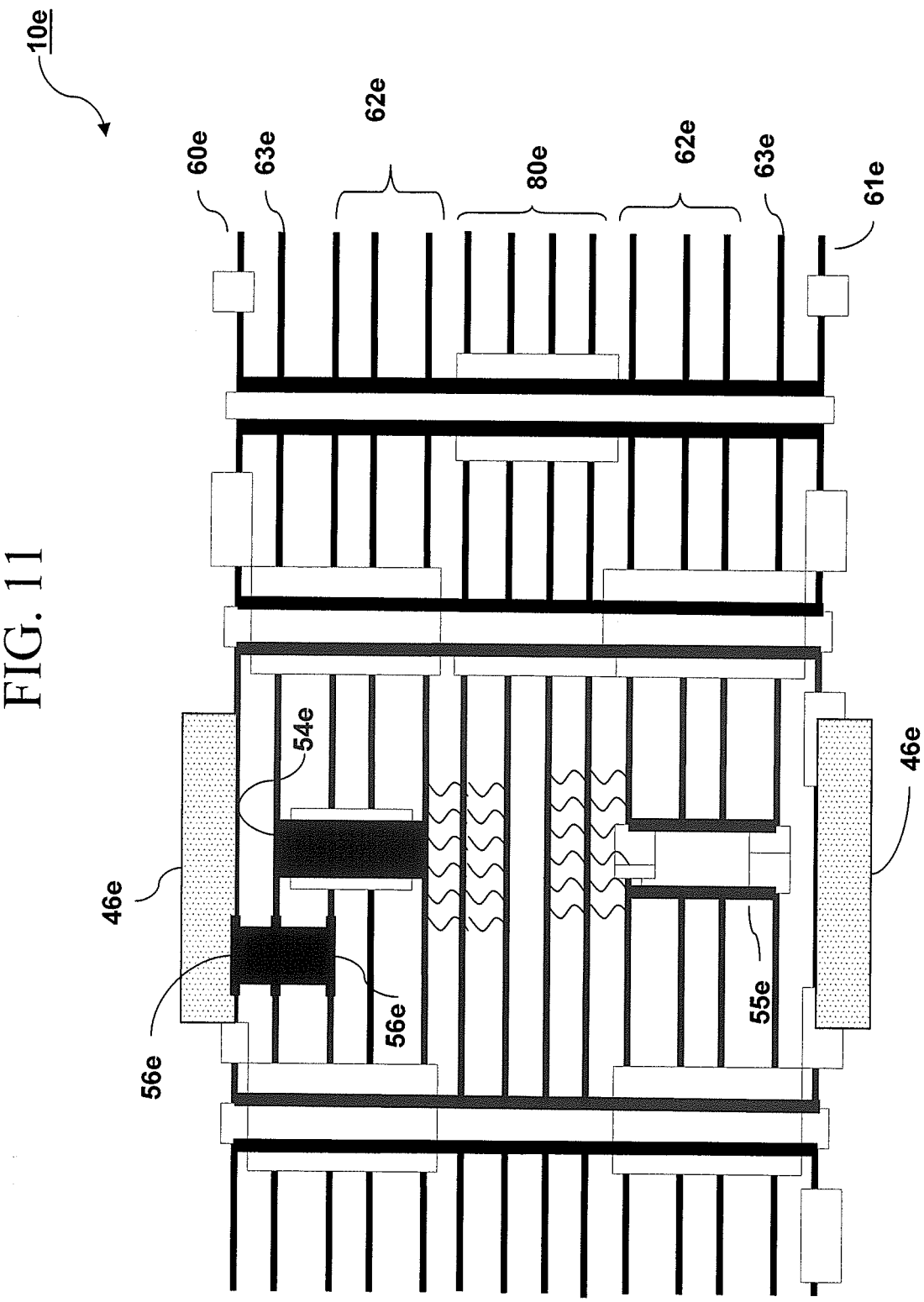
FIG. 11 is a partial cross-sectional view illustrating a multilayer printed circuit board including heater layers, microvias, and buried vias according to an embodiment of the present invention.

In other embodiments of the present invention, the printed circuit board may include micro vias, buried vias, or may include more heater layers. In reference to FIG. 11, FIG. 11 is a cross-sectional view illustrating a multilayer printed circuit board including multiple heater layers, micro-vias, and buried vias according to an embodiment of the present invention. Since the PCB according to the present embodiment may include the same (or substantially the same) elements as previously described embodiments, descriptions of certain aspects of the present embodiment are given by way of reference to the above descriptions and will not be described in detail herein.

While previous embodiments were described as having one or two heater layers included in the printed circuit board, embodiments of the present invention are not limited thereto and may include more than two heaters. For example, a PCB 10e includes four heater layers 80e.

The PCB 10e may include buried vias 54e or solid buried vias 55e. The buried via 54e and the solid buried via 55e are similar to the blind via 53b and solid blind via 51a, except that the buried vias may only coupled together internal conductive layers. Like the previously described vias, the buried via 54e and the solid buried via 55e improve heat transfer from the heater layers 80e to adjacent layers.

In one embodiment, the PCB 10e may include ground plane layers 63e (or other plane layers or solid conductor layers). The ground plane layers 63e may be directly adjacent to (e.g., under or over) the top and bottom conductive layers 60e, 61e. The buried via 54e or the solid buried via 55e may couple together an internal layer 62e adjacent to a heater layer 80e and a ground plane layer 63e. When the heater layers 80e generate heat, the buried via 54e and the solid buried via 55e may transfer heat to the ground plane layers 63e. The ground plane layers may then transfer heat to the top and bottom conductive layers 60e, 61e, thereby heating up the circuit components 46e.

In one embodiment, the PCB 10e may include micro vias 56e. Micro vias 56e are generally smaller than some other types of vias and generally couple between a small number of layers (e.g., layers 1 and 2). Micro vias 56e may also be stacked micro vias, for example, PCB 10e has two micro vias 56e stacked together. Like the other vias, micro vias 56e may improve heat transfer between layers. For example, a micro vias 56e in PCB 10e is configured to transfer heat from a ground plane layer 63e to a circuit component 46e.

While PCBs having an embedded heater according to embodiments of the present invention have been described with having the heater circuit (e.g., the traces) or vias, made of copper, other materials may be used without departing from the spirit or scope of the present invention. For example, high temperature FR4, plyimides, hydro carbon ceramics, or polytetrafluoroethylene (PTFE) materials.

In other embodiment of the present invention, the embedded heater of the PCB may include additional parts that add additional features. For example, including a diode added for a sensing device, resistor to couple multiple layers together, temperature sensors to sense the ambient or device temperatures, or other devices to automate the heat-up process. In one embodiment of the present invention, when the switch to apply operation power is turned-on, operation power will not be allowed into the PCB until the PCB is within the operational temperature range. This may be accomplished automatically or with a manual switch and indicator light.

Figure 12:
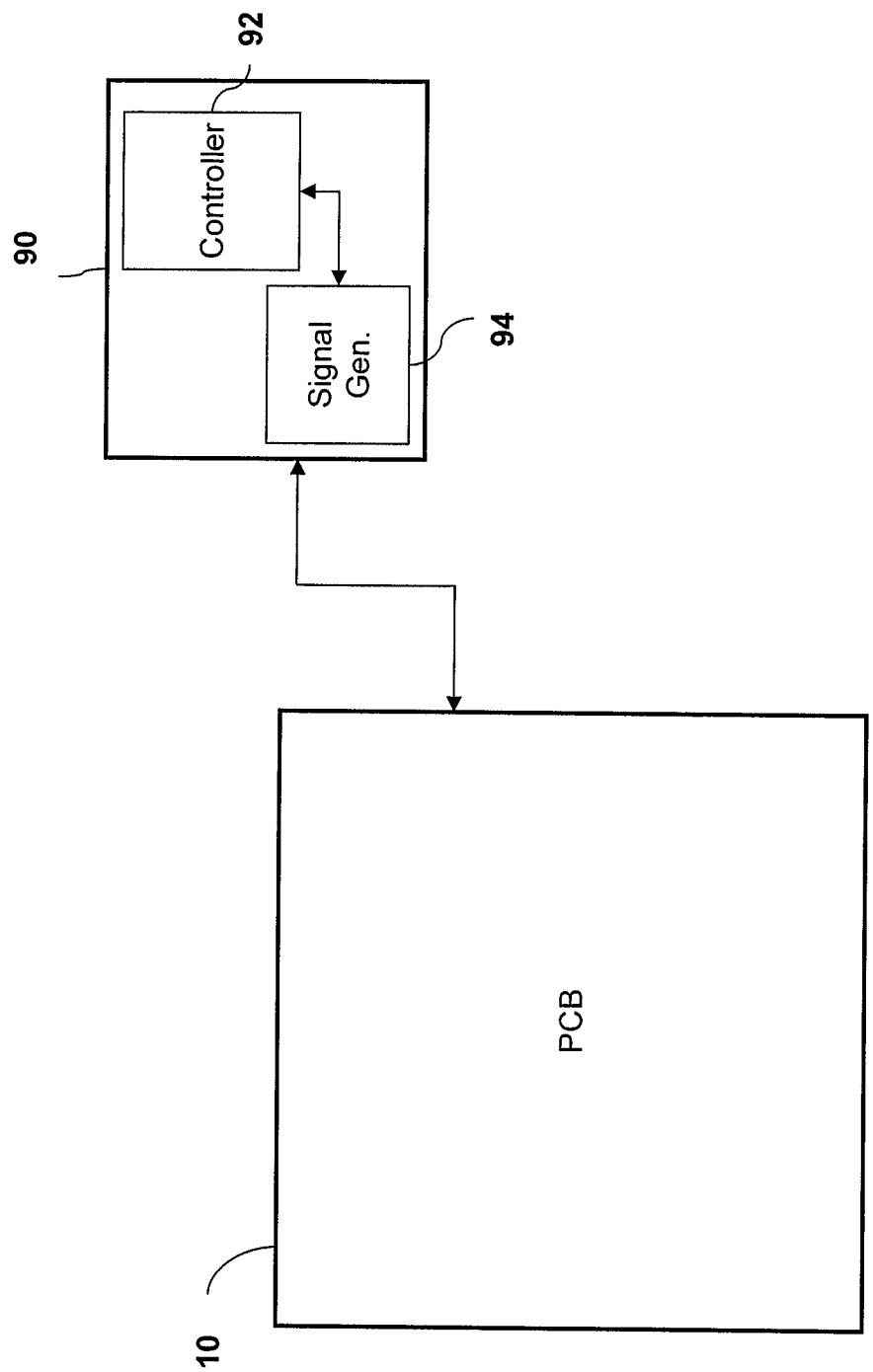
FIG. 12 is a plan view illustrating a heater diver and a multilayer printed circuit board including an embedded heater.

In another embodiment of the present invention, a printed circuit board including an embedded heater may be coupled to an external heater driver. In reference to FIG. 12, FIG. 12 is a plan view illustrating a heater diver and a multilayer printed circuit board including an embedded heater. Since the PCB according to the present embodiment may include the same (or substantially the same) elements as previously described embodiments, descriptions of certain aspects of the present embodiment are given by way of reference to the above descriptions and will not be described in detail herein.

A heater driver 90 may be coupled to an embedded heater of a printed circuit board 10 to provide a driving current to heat up heater circuits and thereby heat up the PCB so that the PCB's components are within an operating temperature range. The heater driver 90 may include a heater driver controller 92, which controls a signal generator 94 for providing the driving current. The heater driver controller may receive temperature, voltage, and current information from the board and the external environment, and control the current supplied to the embedded heater and an operation power supplied to the board according to that information.

Figure 13:
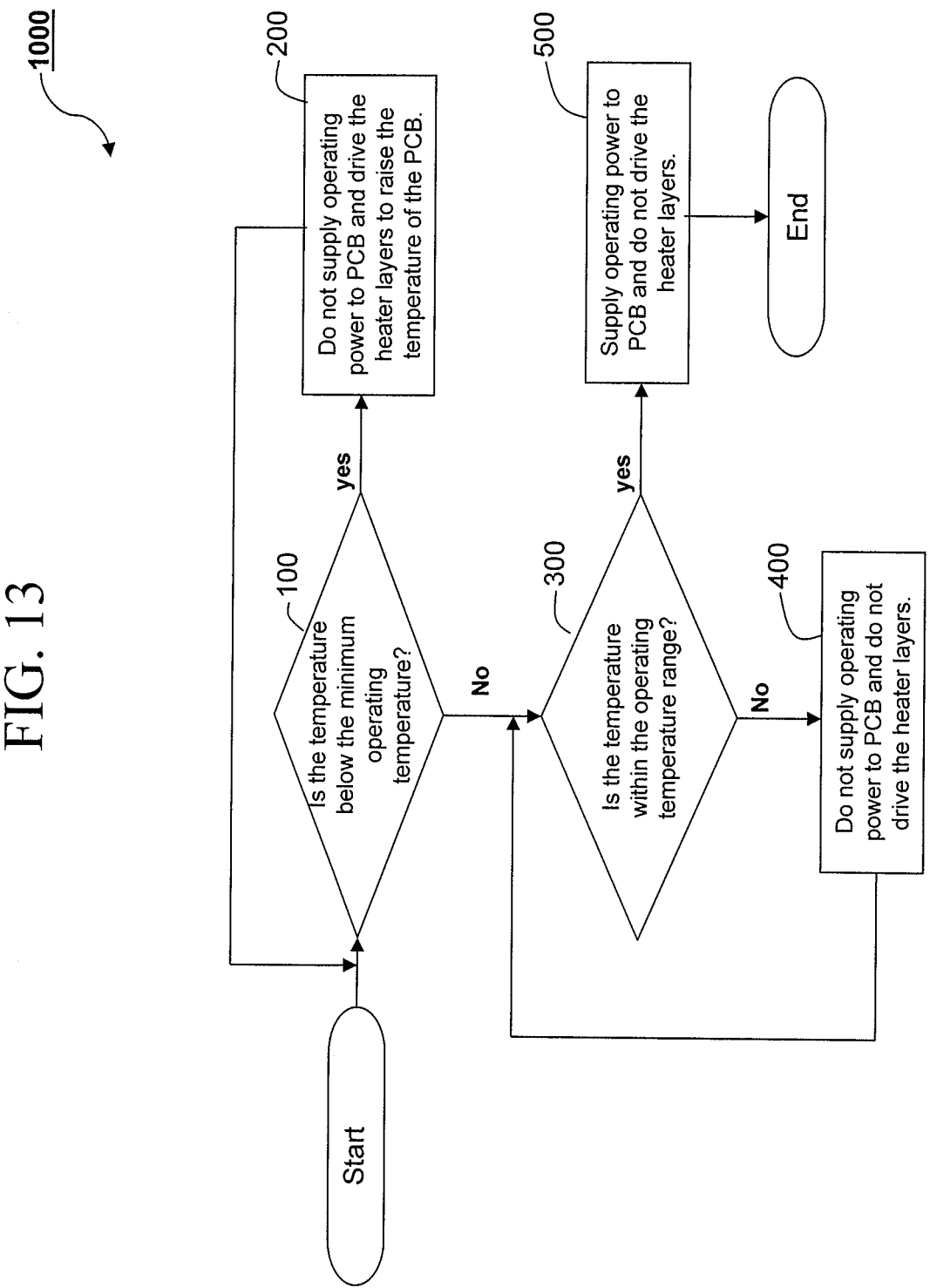
FIG. 13 is a diagram of an operation of an embodiment of the present invention.

FIG. 13 is a diagram illustrating an operation of an embodiment of the present invention. An operation 1000 for controlling the heating of a PCB according to an embodiment of the present invention may be provided as follows.

Sensing a temperature of the PCB (e.g., a circuit component mounted on the PCB). Comparing the temperature to a stored minimum operating temperature. (100).

If the temperature is less than the minimum operating temperature, do not supply an operating power to the PCB and drive the embedded heater to raise the temperature of the PCB until the temperature of the PCB is greater than or equal to the minimum operating temperature. (200).

If the temperature is greater than or equal to the minimum operating temperature, compare the temperature to an operating temperature range. (300).

If the temperature is not within the operating temperature range (e.g., is over the operating temperature range), do not supply the operating power to the PCB and do not drive the embedded heater (the PCB may have been over heated and need to cool down). (400).

If the temperature is within the operating temperature range, supply the operating power to the PCB and do not drive the embedded heater. (500).

Accordingly, embodiments of the present invention provide for printed circuit boards (PCBs) including heaters (e.g., embedded heaters or embedded heater circuits), which have many advantages, including (1) providing heat for components of the PCB, as well as the PCB, by allowing the component's temperature to rise above the component's temperature rating (e.g., a −40 C degree temperature rating); (2) providing heat for the components and PCB relatively quickly and efficiently; and (3) heating up the electronic components and the PCB to an acceptable operating temperature (e.g., a standard or designed operating temperature of the component) prior to turning on the power to the electronic components.

While aspects of the present invention have been particularly shown and described with reference to various embodiments thereof, it will be understood by those of ordinary skill in the art that various changes in form and details may be made therein without departing from the spirit and scope of the present invention as defined by the following claims, and equivalents thereof.

| Description of the Reference Numerals | |
|---|---|
| 10, 10a-10e: | Printed circuit board (PCB). |
| 20: | multilayer non-conductive substrate. |
| 21-26: | non-conductive substrate. |
| 30, 30a: | Input. |
| 35, 35a: | Output. |
| 40: | Surface mount device (SMD). |
| 41: | Area under SMD. |
| 42: | Through hole device (THD). |
| 43: | Area under THD. |
| 44: | Ball grid array (BGD). |
| 45: | Area under BGD. |
| 46a-46e: | Circuit component. |
| 50: | Via. |
| 51a: | Solid blind via. |
| 52a: | Plated via. |
| 53b: | Blind via. |
| 54e: | Buried solid via. |
| 55e: | Buried via. |
| 56e: | Micro via. |
| 60, 60a-60e: | Top conductive layer. |
| 61a-61e: | Bottom conductive layer. |
| 62a-62e: | Internal conductive layer. |
| 63e: | Ground plane layer. |
| 70: | Horizontal heater circuit. |
| 71: | Vertical heater circuit. |
| 72: | Localized heater circuit. |
| 73: | High output portion. |
| 74: | Low output portion. |
| 75: | Multiple-output heater circuit |
| 80a-80e: | Heater layer. |
| 81: | Horizontal heater layer. |
| 82: | Vertical heater layer. |
| 83: | Localized heater layer. |
| 84: | Multiple-output heater layer. |
| 90: | Heater driver. |
| 92: | Controller. |
| 94: | Signal generator. |

What is claimed is:

1. A printed circuit board comprising:
a top conductive layer;
a bottom conductive layer;
a plurality of electronic components arranged on at least one of the top conductive layer or the bottom conductive layer;
a plurality of heater layers interposed between the top conductive layer and the bottom conductive layer, wherein at least one heater layer of the plurality of heater layers is:
separate from and not disposed on or integrated into the top conductive layer or the bottom conductive layer;
configured to generate and transfer heat to at least one of the electronic components;
wherein the each heater layer of the plurality of heater layers comprises:
an input via;
an output via;
a substrate; and
a conductive pattern located on the substrate and configured to generate heat according to a driving signal, the conductive pattern being electrically coupled between the input via and the output via; and
wherein the plurality of heater layers comprises:
a horizontal heating layer comprising a horizontal conductive pattern, the horizontal conductive pattern comprising a plurality of conductive traces arranged in substantially parallel lines along a horizontal direction of the printed circuit board and electrically coupled in series between the input via and the output via of the horizontal heating layer by a plurality of connecting traces, a vertical heating layer comprising a vertical conductive pattern, the vertical conductive pattern comprising another plurality of conductive traces arranged in substantially parallel lines along a vertical direction of the printed circuit board and electrically coupled in series between the input via and the output via of the vertical heating layer by another plurality of connecting traces, and the horizontal heating layer and the vertical heating layer are arranged so that one of the horizontal heating layer or the vertical heating layer overlaps the other to form a heater grid.

2. The printed circuit board of claim 1, wherein at least one of the electronic components has an operating temperature range, and the heater layer is configured to generate heat to raise the temperature of the at least one electronic component from a first temperature below the operating temperature range to a second temperature within the operating temperature range.

3. The printed circuit board of claim 2, wherein the operating temperature range is from about −40 to about 85 degrees Celsius.

4. The printed circuit board of claim 1 further comprising:
a plurality of internal conductive layers for conducting signals when the printed circuit board is in operation, the internal conductive layers being interposed between the top conductive layer and the bottom conductive layer.

5. The printed circuit board of claim 4, wherein:
at least one of the plurality of internal conductive layers comprises a solid conductor layer adjacent to the heating layer;
the solid conductor layer is coupled to a conductor pad on one of the top conductive layer or the bottom conductor layer; and
the solid conductor layer is configured to direct a thermal path to the conductor pad.

6. The printed circuit board of claim 4, wherein:
the internal conductive layers are interposed between the heater layers and at least one of the top conductive layer and the bottom conductive layer, or
the heater layers are interposed between the internal conductive layers and at least one of the top conductive layer and the bottom conductive layer.

7. The printed circuit board of claim 1, wherein:
the heater layer has a heating region and a non-heating region,
the conductive pattern is arranged in the heating region,
each of the top conductive layer and the bottom conductive layer has a heated region,
each heated region corresponding to an area overlapping the heating region, and
the heater layer is configured to direct heat transfer to each of the heated regions.

8. The printed circuit board of claim 1, wherein:
the conductive pattern has a high output section and a low output section,
the high output section has higher electrical resistance per unit length than the low output section,
the high output section is coupled in series with the low output section between the input via and the output via, and
the conductive pattern is configured to generate more heat in the high output section than in the low output section.

9. The printed circuit board of claim 1, further comprising:
a plurality of conductive patterns on the substrate comprising the conductive pattern, wherein:
at least one of the conductive patterns is coupled in parallel with the other conductive patterns between the input via and the output via.

10. The printed circuit board of claim 1 further comprising:
a via coupling a conductive layer to another conductive layer, wherein the via is interposed between the heater and an electronic component of the electronic components for transferring heat generated by the heater layer to an area adjacent to the electronic component where the via is coupled to.

11. A system for heating a printed circuit board, the system comprising:
the printed circuit board comprising:
a top conductive layer; a bottom conductive layer;
a plurality of electronic components arranged on at least one of the top conductive layer or the bottom conductive layer;
a plurality of heater layers interposed between the top conductive layer and the bottom conductive layer, wherein at least one particular heater layer of the plurality of heater layers is:
separate from and not disposed on or integrated into the top conductive layer or the bottom conductive layer; and
configured to generate and transfer heat to at least one of the electronic components;
wherein the at least one particular heater layer comprises:
an input via;
an output via;
a substrate; and
a conductive pattern located on the substrate and configured to generate heat according to a driving signal, the conductive pattern being electrically coupled between the input via and the output via; and
wherein the plurality of heater layers comprises:
a horizontal heating layer comprising a horizontal conductive pattern, the horizontal conductive pattern comprising a plurality of conductive traces arranged in substantially parallel lines along a horizontal direction of the printed circuit board and electrically coupled in series between the input via and the output via of the horizontal heating layer by a plurality of connecting traces, a vertical heating layer comprising a vertical conductive pattern, the vertical conductive pattern comprising another plurality of conductive traces arranged in substantially parallel lines along a vertical direction of the printed circuit board and electrically coupled in series between the input via and the output via of the vertical heating layer by another plurality of connecting traces, and the horizontal heating layer and the vertical heating layer are arranged so that one of the horizontal heating layer or the vertical heating layer overlaps the other to form a heater grid; and
a heater driver coupled to the printed circuit board.

12. The system of claim 11, wherein the heater driver comprises:
a signal generator for generating a signal to drive the heater layer, and a controller for controlling the signal generator.

13. The system of claim 12, wherein:
the signal generator is coupled to a conductive pattern in the heater layer;
the controller is coupled to a temperature sensor on the printed circuit board; and
the controller is configured to receive temperature data from the temperature sensor and to control the signal generator to output the signal according to the received temperature data.

* * * * *